United States Patent
Merker et al.

(10) Patent No.: US 12,401,339 B2
(45) Date of Patent: Aug. 26, 2025

(54) SURFACE-ACOUSTIC-WAVE (SAW) FILTER WITH DIELECTRIC MATERIAL DISPOSED IN A PIEZOELECTRIC LAYER

(71) Applicant: RF360 Singapore Pte. Ltd., Munich (DE)

(72) Inventors: Michael Merker, Munich (DE); Stefan Ammann, Grosskarolinenfeld (DE); Marc Esquius Morote, Munich (DE); Matthias Pernpeintner, Grafing (DE)

(73) Assignee: RF360 Singapore Pte. Ltd., Republic Plaza (SG)

( * ) Notice: Subject to any disclaimer, the term of this patent is extended or adjusted under 35 U.S.C. 154(b) by 291 days.

(21) Appl. No.: 17/806,628

(22) Filed: Jun. 13, 2022

(65) Prior Publication Data
US 2023/0402989 A1   Dec. 14, 2023

(51) Int. Cl.
*H03H 9/02*   (2006.01)

(52) U.S. Cl.
CPC .... *H03H 9/02574* (2013.01); *H03H 9/02535* (2013.01); *H03H 9/02992* (2013.01); *H03H 2009/02299* (2013.01)

(58) Field of Classification Search
CPC .......... H03H 9/02574; H03H 9/02992; H03H 2009/02299; H03H 9/02653; H03H 9/14538; H03H 9/02858; H03H 9/02535
USPC ......................................... 333/133, 193–196
See application file for complete search history.

(56) References Cited

U.S. PATENT DOCUMENTS

| | | | |
|---|---|---|---|
| 9,673,779 B2 | 6/2017 | Ruile et al. | |
| 10,069,477 B2* | 9/2018 | Nakazawa | H03H 9/02622 |
| 10,985,726 B2 | 4/2021 | Plesski et al. | |
| 2015/0243873 A1 | 8/2015 | Nakanishi et al. | |
| 2019/0334500 A1 | 10/2019 | Horikawa | |
| 2021/0161577 A1 | 6/2021 | Johansson | |
| 2022/0360249 A1* | 11/2022 | Ballandras | H03H 3/08 |

FOREIGN PATENT DOCUMENTS

| | | |
|---|---|---|
| CN | 111211755 A | 5/2020 |
| CN | 112886941 A | 6/2021 |
| WO | 2021136756 A1 | 7/2021 |

OTHER PUBLICATIONS

Machine English Translation of CN112886941A Published on Jun. 1, 2021 (Year: 2021).*
Partial International Search Report—PCT/SG2023/050341—ISA/EPO—Aug. 24, 2023, 10 pages.
International Search Report and Written Opinion—PCT/SG2023/050341—ISA/EPO—Nov. 14, 2023, 20 pages.

* cited by examiner

*Primary Examiner* — Jorge L Salazar, Jr.
(74) *Attorney, Agent, or Firm* — Polsinelli

(57) ABSTRACT

An apparatus is disclosed for implementing a surface-acoustic-wave (SAW) filter with dielectric material disposed in a piezoelectric layer. In an example aspect, the apparatus includes a surface-acoustic-wave filter with a piezoelectric layer, an electrode structure, and dielectric material. The piezoelectric layer has at least one channel. The dielectric material is disposed in the at least one channel of the piezoelectric layer and is at least partially covered by the electrode structure.

24 Claims, 12 Drawing Sheets

SURFACE-ACOUSTIC-WAVE (SAW) FILTER WITH DIELECTRIC MATERIAL DISPOSED IN A PIEZOELECTRIC LAYER

TECHNICAL FIELD

This disclosure relates generally to wireless transceivers and other components that employ filters and, more specifically, to a surface-acoustic-wave (SAW) filter with dielectric material disposed in at least one channel of a piezoelectric layer.

BACKGROUND

Electronic devices use radio-frequency (RF) signals to communicate information. These radio-frequency signals enable users to talk with friends, download information, share pictures, remotely control household devices, and receive global positioning information. To transmit or receive the radio-frequency signals within a given frequency band, the electronic device may use filters to pass signals within the frequency band and to suppress (e.g., attenuate) jammers or noise having frequencies outside of the frequency band. It can be challenging, however, to design a filter that provides filtering for radio-frequency applications, including those that utilize frequencies above 2 gigahertz (GHz).

SUMMARY

An apparatus is disclosed that implements a surface-acoustic-wave (SAW) filter with dielectric material disposed in a piezoelectric layer. Instead of increasing the mass of an electrode structure within a trap region of a surface-acoustic-wave filter, example techniques use a piezoelectric layer with at least one channel present within the trap region. Dielectric material is disposed in the channel and enables the surface-acoustic-wave filter to operate in a piston mode. With the dielectric material at least partially embedded within the piezoelectric layer, the surface-acoustic-wave filter can attenuate spurious modes across a wider range of frequencies compared to other spurious-mode suppression techniques. Additionally, disposing the dielectric material within the channel of the piezoelectric layer can be easier to manufacture, especially for high-frequency applications, compared to other spurious-mode suppression techniques.

In an example aspect, an apparatus for filtering is disclosed. The apparatus includes a surface-acoustic-wave filter with a piezoelectric layer, an electrode structure, and dielectric material. The piezoelectric layer has at least one channel. The dielectric material is disposed in the at least one channel of the piezoelectric layer and is at least partially covered by the electrode structure.

In an example aspect, an apparatus for filtering is disclosed. The apparatus includes a surface-acoustic-wave filter configured to generate a filtered signal from a radio-frequency signal. The surface-acoustic-wave filter includes means for converting the radio-frequency signal to an acoustic wave and converting a propagated acoustic wave into the filtered signal. The surface-acoustic-wave filter also includes means for propagating the acoustic wave across a planar surface to produce the propagated acoustic wave. The surface-acoustic-wave filter additionally includes means for operating in accordance with a piston mode. The means for operating is disposed in the means for propagating and is at least partially covered by the means for converting.

In an example aspect, a method for manufacturing a surface-acoustic-wave filter is disclosed. The method includes providing a piezoelectric layer. The method also includes etching at least one channel across a surface of the piezoelectric layer. Additionally, the method includes depositing dielectric material within the at least one channel. The method further includes providing an electrode structure that at least partially covers the dielectric material.

In an example aspect, an apparatus is disclosed. The apparatus include a piezoelectric layer and dielectric material. The piezoelectric layer is configured to propagate an acoustic wave along a first axis. The piezoelectric layer has at least one recessed area with a longitudinal axis that is substantially parallel to the first axis. The dielectric material is positioned in the recessed area and has at least one surface exposed.

BRIEF DESCRIPTION OF DRAWINGS

FIG. 4-1 illustrates an example implementation of a thin-film surface-acoustic-wave filter with dielectric material disposed in a piezoelectric layer.

FIG. 4-2 illustrates an example implementation of a high-quality temperature-compensated surface-acoustic-wave filter with dielectric material disposed in a piezoelectric layer.

DETAILED DESCRIPTION

Figure 1:
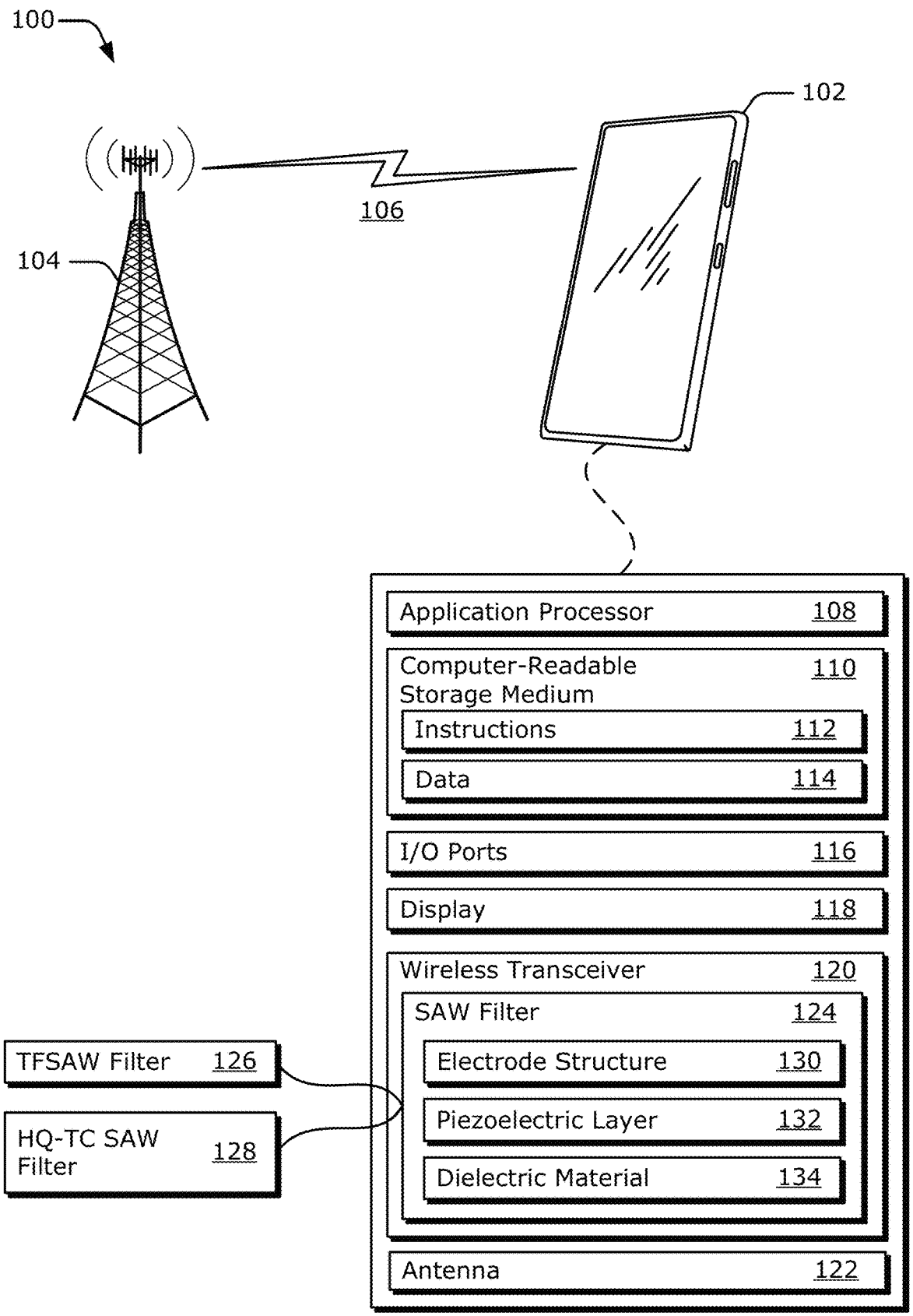
FIG. 1 illustrates an example operating environment for a surface-acoustic-wave filter with dielectric material disposed in a piezoelectric layer.

To transmit or receive radio-frequency signals within a given frequency band, an electronic device may use filters to pass signals within the frequency band and to suppress (e.g., attenuate) jammers or noise having frequencies outside of the frequency band. Electroacoustic devices (e.g., "acoustic filters") can be used to filter high-frequency signals in many applications, such as those with frequencies that are greater than 100 megahertz (MHz). An acoustic filter is tuned to pass certain frequencies (e.g., frequencies within its passband) and attenuate other frequencies (e.g., frequencies that are outside of its passband). Using piezoelectric material as a vibrating medium, the acoustic filter operates by transforming an electrical signal wave that is propagating along an electrical conductor into an acoustic wave (e.g., an acoustic signal wave) that forms across the piezoelectric material. The acoustic wave is then converted back into an electrical filtered signal. The acoustic filter can include an electrode structure that transforms or converts between the electrical and acoustic waves.

The acoustic wave propagates across the piezoelectric material at a velocity having a magnitude that is significantly less than that of the propagation velocity of the electromagnetic wave. Generally, the magnitude of the propagation velocity of a wave is proportional to a size of a wavelength of the wave. Consequently, after conversion of the electrical signal wave into the acoustic signal wave, the wavelength of the acoustic signal wave is significantly smaller than the wavelength of the electrical signal wave. The resulting smaller wavelength of the acoustic signal wave enables filtering to be performed using a smaller filter device. This permits acoustic filters to be used in space-constrained devices, including portable electronic devices such as cellular phones.

It can be challenging, however, to design an acoustic filter that can provide filtering for high-frequency applications, including those that utilize frequencies above 2 gigahertz (GHz), while maintaining or reducing spurious modes (e.g., spurious wave modes) below certain levels within a passband. A spurious mode is an undesired mode, which can degrade performance of the acoustic filter. Some filter designs customize a geometry of the electrode structure of the acoustic filter to attenuate spurious modes. As an example, fingers within the electrode structure can have varying widths or heights across the length of the fingers. In particular, a finger can have a wider and/or taller profile (e.g., include a hammerhead and dot, respectively) within a trap region of the acoustic filter compared to an active track region of the acoustic filter. Within the trap region and the active track region, the projection of adjacent fingers of the acoustic filter overlap. The trap region borders the active track region and can include ends of the fingers. The addition of hammerheads and dots to the fingers increase the mass of the electrode structure within the trap region relative to the active track region. Customizing the electrode structure in this way can attenuate (e.g., suppress) some types of spurious modes.

Although this technique enables suppression of a spurious mode, it can be challenging to apply this technique to acoustic filters that support higher frequencies, such as those used in frequency bands 7, 40, 41, n77, and n79; with Wi Fi® at 2.4 GHz; with 5 GHz frequencies; and/or at sub-6 GHz frequencies. In particular, a size of the hammerhead or dot within the trap region can become too small or potentially less practical or costly for the manufacturing equipment in some scenarios to accurately be produced due to lithographic constraints.

To overcome these difficulties, another technique applies a dielectric bar across fingers of the electrode structure to suppress spurious modes. In some implementations, the dielectric bar has a thickness on the order of tens of nanometers, such as approximately 20 nanometers. The dielectric bar, however, can be affected by subsequent manufacturing processes, such as trimming or passivation. Also, the dielectric bar may be unable to provide sufficient spurious-mode suppression across a desired range of frequencies.

To address these challenges, example techniques for implementing a surface-acoustic-wave (SAW) filter with dielectric material disposed in a piezoelectric layer are described. Instead of or in addition to increasing the mass of an electrode structure within a trap region of a surface-acoustic-wave filter, example techniques use a piezoelectric layer with at least one channel present within the trap region. Dielectric material is disposed in the channel and enables the surface-acoustic-wave filter to operate in a piston mode.

There are several benefits that result from certain implementations of a surface-acoustic-wave filter with dielectric material disposed in the piezoelectric layer. These benefits can include operational improvements, manufacturing advantages, or both. One operational benefit is the suppression of spurious modes. In particular, the dielectric material causes an acoustic wave to have a lower velocity within the trap region in comparison to the active track region. The lower velocity within the trap region suppresses spurious modes, such as a transversal mode. By tailoring the geometry of the dielectric material within the trap region, the dielectric material can attenuate spurious modes across a wider range of frequencies compared to other techniques.

From a manufacturing perspective, the techniques for disposing dielectric material within the piezoelectric layer can be potentially easier to implement compared to the techniques for applying hammerheads or dots, especially for high-frequency applications. Also, in contrast to the dielectric bars, embedding the dielectric material within the piezoelectric layer creates the acoustic-wave confinement prior to the realization of the metallization of the electrode structure. As the electrode structure at least partially covers the dielectric material, the dielectric material is less exposed to the subsequent manufacturing processes, such as trimming and passivation, compared to the dielectric bar. In this way, the surface-acoustic-wave filter with the dielectric material disposed in the piezoelectric layer can experience less performance degradation to the piston mode by the subsequent processing steps compared to another surface-acoustic-wave filter with the dielectric bar. Also, the surface-acoustic-wave filter with the dielectric material disposed in the piezoelectric layer can experience less electrical losses due to less subsequent fabrication steps after deposition of the electrode structure compared to the other surface-acoustic-wave filter with the dielectric bar.

FIG. 1 illustrates an example environment 100 for operating a surface-acoustic-wave filter with dielectric material disposed in a piezoelectric layer. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 122. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 122.

In the example shown in FIG. 1, the wireless transceiver 120 includes at least one surface-acoustic-wave filter 124 (SAW filter 124). In some implementations, the wireless transceiver 120 includes multiple surface-acoustic-wave filters 124, which can be formed from surface-acoustic-wave resonators arranged in series, in parallel, in a ladder structure, in a lattice structure, or some combination thereof. The surface-acoustic-wave filter 124 can be a thin-film surface-acoustic-wave filter 126 (TFSAW filter 126), a high-quality temperature-compensated surface-acoustic-wave filter (HQ-TC SAW filter), or another type of surface-acoustic-wave filter not shown.

The surface-acoustic-wave filter 124 includes at least one electrode structure 130, at least one piezoelectric layer 132 (or piezoelectric material), and dielectric material 134 (e.g., a dielectric or at least one dielectric layer). The dielectric material 134 is at least partially embedded within the piezoelectric layer 132 and is at least partially covered by the electrode structure 130. With this dielectric material 134, the surface-acoustic-wave filter 124 can operate in a piston mode and attenuate spurious modes, such as a transversal mode. In general, the piston mode is characterized by a longitudinal velocity that varies in a transverse direction (e.g., along a second (Y) axis 412 described with respect to FIGS. 4-1 to 9). The piston mode reduces energy losses by reducing acoustic-wave propagation outside an active track region of the surface-acoustic-wave filter 124 in the transverse direction and by reducing transversally standing waves within the active track region. The surface-acoustic-wave filter 124 is further described with respect to FIG. 2.

Figure 2:
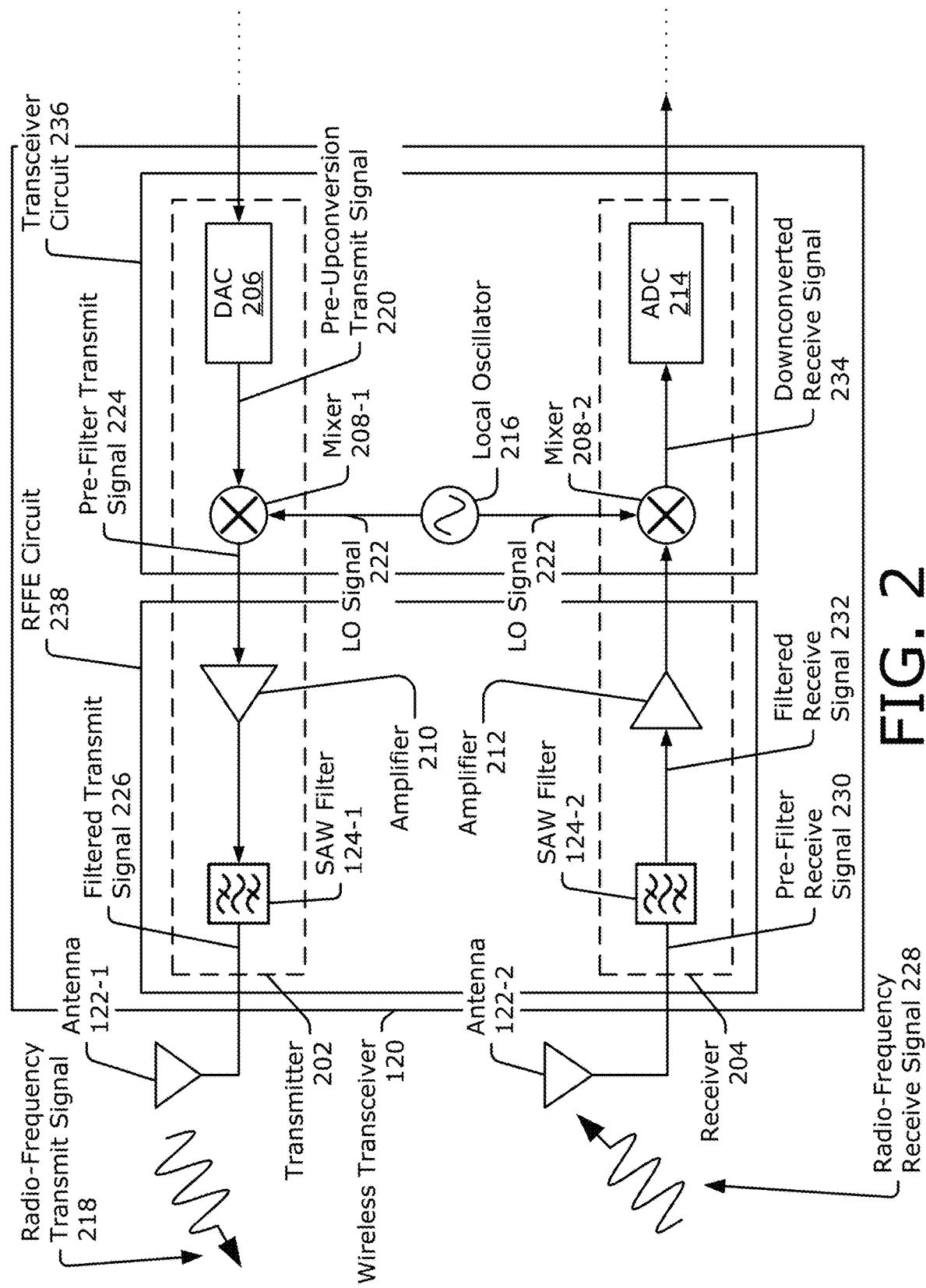
FIG. 2 illustrates an example wireless transceiver including at least one surface-acoustic-wave filter with dielectric material disposed in a piezoelectric layer.

FIG. 2 illustrates an example wireless transceiver 120. In the depicted configuration, the wireless transceiver 120 includes a transmitter 202 and a receiver 204, which are respectively coupled to a first antenna 122-1 and a second antenna 122-2. In other implementations, the transmitter 202 and the receiver 204 can be connected to a same antenna through a duplexer (not shown). The transmitter 202 is shown to include at least one digital-to-analog converter 206 (DAC 206), at least one first mixer 208-1, at least one amplifier 210 (e.g., a power amplifier), and at least one first surface-acoustic-wave filter 124-1. The receiver 204 includes at least one second surface-acoustic-wave filter 124-2, at least one amplifier 212 (e.g., a low-noise amplifier), at least one second mixer 208-2, and at least one analog-to-digital converter 214 (ADC 214). The first mixer 208-1 and the second mixer 208-2 are coupled to a local oscillator 216. Although not explicitly shown, the digital-to-analog converter 206 of the transmitter 202 and the analog-to-digital converter 214 of the receiver 204 can be coupled to the application processor 108 (of FIG. 1) or another processor associated with the wireless transceiver 120 (e.g., a modem).

In some implementations, the wireless transceiver 120 is implemented using multiple circuits (e.g., multiple integrated circuits), such as a transceiver circuit 236 and a radio-frequency front-end (RFFE) circuit 238. As such, the components that form the transmitter 202 and the receiver 204 are distributed across these circuits. As shown in FIG. 2, the transceiver circuit 236 includes the digital-to-analog converter 206 of the transmitter 202, the mixer 208-1 of the transmitter 202, the mixer 208-2 of the receiver 204, and the analog-to-digital converter 214 of the receiver 204. In other implementations, the digital-to-analog converter 206 and the analog-to-digital converter 214 can be implemented on another separate circuit that includes the application processor 108 or the modem. The radio-frequency front-end circuit 238 includes the amplifier 210 of the transmitter 202, the surface-acoustic-wave filter 124-1 of the transmitter 202, the surface-acoustic-wave filter 124-2 of the receiver 204, and the amplifier 212 of the receiver 204.

During transmission, the transmitter 202 generates a radio-frequency transmit signal 218, which is transmitted using the antenna 122-1. To generate the radio-frequency transmit signal 218, the digital-to-analog converter 206 provides a pre-upconversion transmit signal 220 to the first mixer 208-1. The pre-upconversion transmit signal 220 can be a baseband signal or an intermediate-frequency signal. The first mixer 208-1 upconverts the pre-upconversion transmit signal 220 using a local oscillator (LO) signal 222 provided by the local oscillator 216. The first mixer 208-1 generates an upconverted signal, which is referred to as a pre-filter transmit signal 224. The pre-filter transmit signal 224 can be a radio-frequency signal and include some noise or unwanted frequencies, such as a harmonic frequency. The amplifier 210 amplifies the pre-filter transmit signal 224 and passes the amplified pre-filter transmit signal 224 to the first surface-acoustic-wave filter 124-1.

The first surface-acoustic-wave filter 124-1 filters the amplified pre-filter transmit signal 224 to generate a filtered transmit signal 226. As part of the filtering process, the first surface-acoustic-wave filter 124-1 attenuates the noise or unwanted frequencies within the pre-filter transmit signal 224. The transmitter 202 provides the filtered transmit signal 226 to the antenna 122-1 for transmission. The transmitted filtered transmit signal 226 is represented by the radio-frequency transmit signal 218.

During reception, the antenna 122-2 receives a radio-frequency receive signal 228 and passes the radio-frequency receive signal 228 to the receiver 204. The second surface-acoustic-wave filter 124-2 accepts the received radio-frequency receive signal 228, which is represented by a pre-filter receive signal 230. The second surface-acoustic-wave filter 124-2 filters any noise or unwanted frequencies within the pre-filter receive signal 230 to generate a filtered receive signal 232.

The amplifier 212 of the receiver 204 amplifies the filtered receive signal 232 and passes the amplified filtered receive signal 232 to the second mixer 208-2. The second mixer 208-2 downconverts the amplified filtered receive signal 232 using the local oscillator signal 222 to generate the downconverted receive signal 234. The analog-to-digital converter 214 converts the downconverted receive signal 234 into a digital signal, which can be processed by the application processor 108 or another processor associated with the wireless transceiver 120 (e.g., the modem).

FIG. 2 illustrates one example configuration of the wireless transceiver 120. Other configurations of the wireless transceiver 120 can support multiple frequency bands and share an antenna 122 across multiple transceivers. One of ordinary skill in the art can appreciate the variety of other configurations for which surface-acoustic-wave filters 124 may be included. For example, the surface-acoustic-wave filters 124 can be integrated within duplexers or diplexers of the wireless transceiver 120. Example implementations of the surface-acoustic-wave filter 124-1 or 124-2 are further described with respect to FIGS. 3 to 9.

Figure 3:
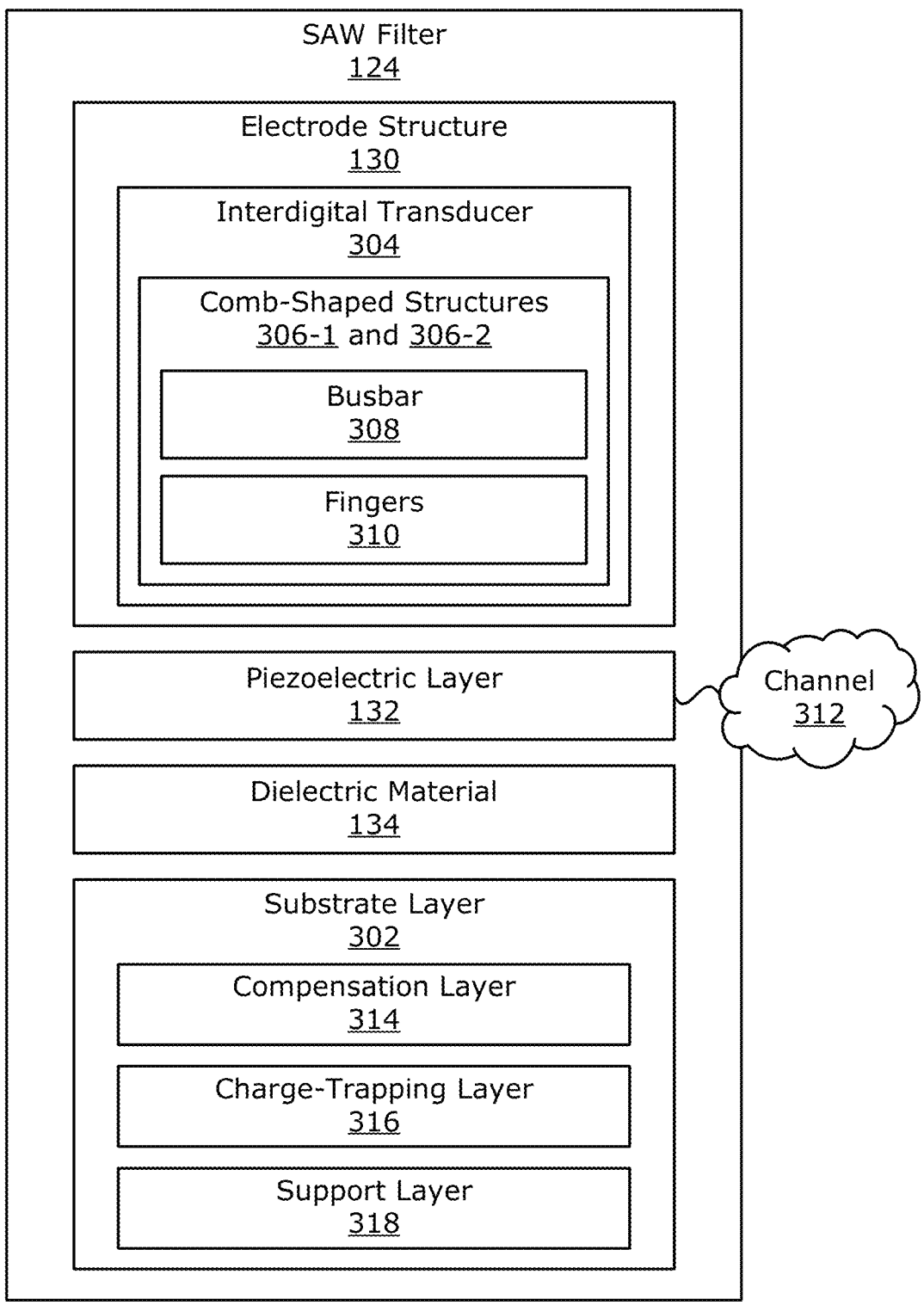
FIG. 3 illustrates example components of a surface-acoustic-wave filter with dielectric material disposed in a piezoelectric layer.

FIG. 3 illustrates example components of the surface-acoustic-wave filter 124. In the depicted configuration, the surface-acoustic-wave filter 124 includes the electrode structure 130, the piezoelectric layer 132, the dielectric material 134, and at least one substrate layer 302. The electrode structure 130 comprises an electrically conductive material, such as metal, and can include one or more layers. The one or more layers can include one or more metal layers and can optionally include one or more adhesion layers. As an example, the metal layers can be composed of aluminium (Al), copper (Cu), silver (Ag), gold (Au), tungsten (W), platinum (Pt), or some combination or doped version thereof. The adhesion layers can be composed of chromium (Cr), titanium (Ti), molybdenum (Mo), or some combination thereof.

The electrode structure 130 can include one or more interdigital transducers 304. The interdigital transducer 304 converts an electrical signal into an acoustic wave and converts the acoustic wave into a filtered electrical signal. The interdigital transducer 304 includes at least two comb-shaped structures 306-1 and 306-2. Each comb-shaped structure 306-1 and 306-2 includes a busbar 308 (e.g., a conductive segment or rail) and multiple fingers 310 (e.g., electrode fingers). An example interdigital transducer 304 is further described with respect to FIGS. 4-1 and 4-2. Although not explicitly shown, the electrode structure 130 can also include two or more reflectors. In an example implementation, the interdigital transducer 304 is arranged between two reflectors, which reflect the acoustic wave back towards the interdigital transducer 304.

In example implementations, the piezoelectric layer 132 can be implemented using a variety of different materials that exhibit piezoelectric properties (e.g., can transfer mechanical energy into electrical energy or electrical energy into mechanical energy). Example types of material include lithium niobate ($LiNbO_3$), lithium tantalate ($LiTaO_3$), quartz, aluminium nitride (AlN), aluminium scandium nitride (AlScN), or some combination thereof. In general, the material that forms the piezoelectric layer 132 has a crystalline structure. This crystalline structure is defined by an ordered arrangement of particles (e.g., atoms, ions, or molecules).

The piezoelectric layer 132 has at least one channel 312 (e.g., at least one recess area or at least one trench) on a surface that faces the electrode structure 130. The channel 312 can be proximate to the beginning and/or ends of the fingers 310 of the electrode structure 130. The term "proximate" can refer to the channel 312 being closer to the beginning or ends of the fingers 310 compared to a middle or center portion of the fingers 310. Explained another way, the channel 312 is aligned with the beginning and/or ends of the finger 310 such that it is disposed within a trap region of the surface-acoustic-wave filter 124, which is further described with respect to FIG. 5. In general, the channel 312 can pass "below" one or more fingers 310 of the electrode structure 130.

Figure 6:
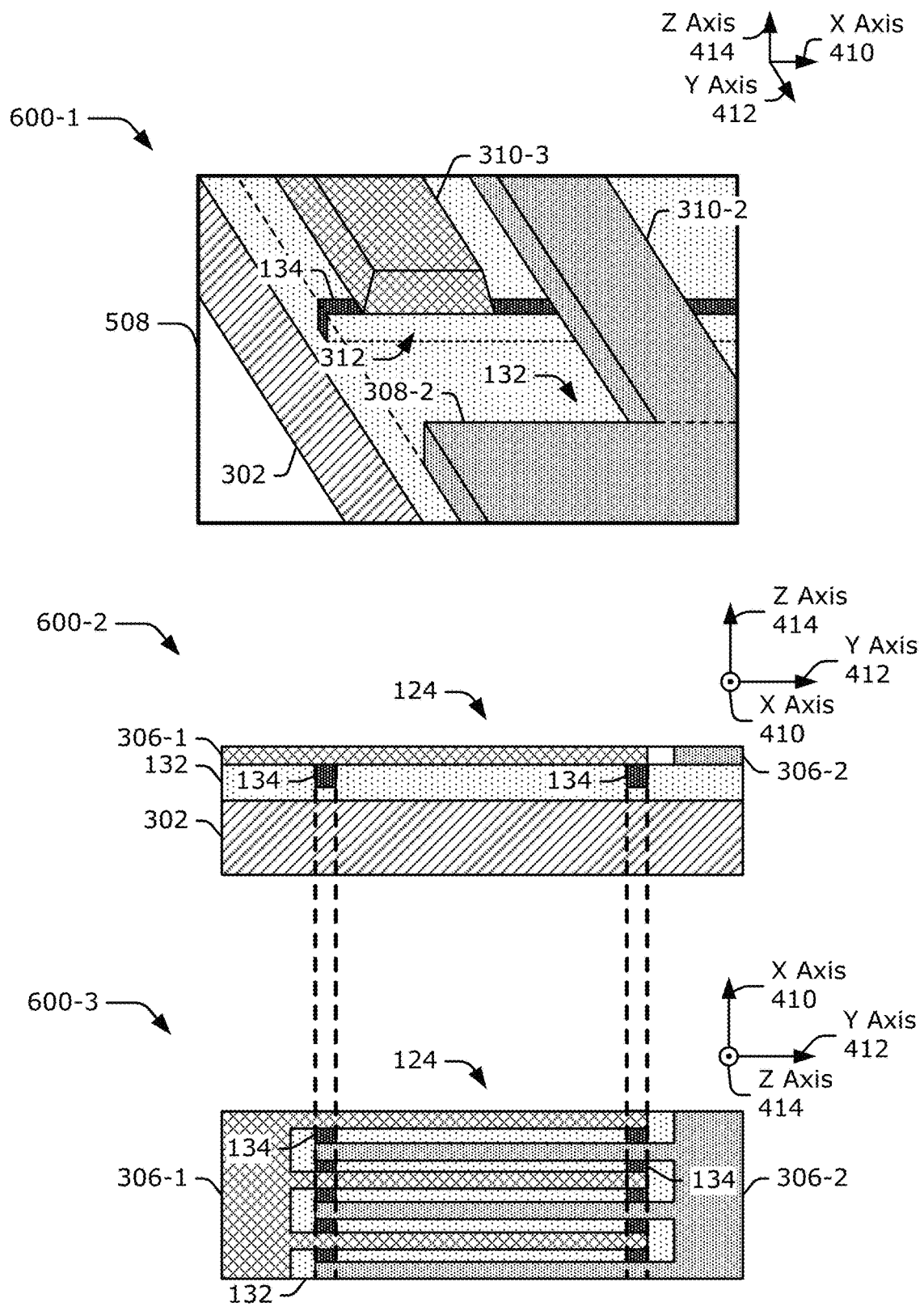
FIG. 6 illustrates a first example implementation of a surface-acoustic-wave filter with dielectric material disposed in a piezoelectric layer.

In some implementations, the channel 312 includes one channel that is proximate to a boundary of an active track region of the surface-acoustic-wave filter 124, as further described with respect to FIG. 6. In other implementations, the channel 312 is implemented using two or more channels that are substantially parallel and are proximate to a boundary of the active track region, as further described with respect to FIG. 7. In still other implementations, the channel 312 includes multiple segmented channels that are aligned along an axis that is substantially parallel to the direction of acoustic-wave propagation and are proximate to a boundary of the active track region. These segmented channels can be partially covered by the electrode structure 130, as described with respect to FIG. 8, fully covered by the electrode structure 130, as described with respect to FIG. 9, or some combination thereof. In some implementations, a longitudinal axis of the channel 312 is substantially orthogonal to longitudinal axes of the fingers 310. Also, the longitudinal axis of the channel 312 can be substantially parallel to the direction of acoustic-wave propagation, as further described with respect to FIGS. 4-1 and 4-2.

The dielectric material 134 can be formed using a variety of different types of dielectric material, such as tantalum oxide ($Ta_2O_5$), silicon oxide (SiO), silicon dioxide ($SiO_2$), silicon nitride (SiN), hafnium oxide ($HfO_2$), aluminum oxide ($Al_2O_3$), tungsten trioxide ($WO_3$), niobium pentoxide ($Nb_2O_5$), or some combination or doped version thereof. In some implementations, the dielectric material 134 is implemented using multiple layers formed using the same material or different materials. The dielectric material 134 can be at least partially buried or embedded within the piezoelectric layer 132. In particular, the dielectric material 134 is disposed in (or positioned in) the one or more channels 312 of the piezoelectric layer 132. In general, a surface of the dielectric material 134 that faces the electrode structure 130 is exposed or not covered by the piezoelectric layer 132. In some implementations, at least a portion of the surface of the dielectric material 134 can be in direct contact with the electrode structure 130. In alternative implementations, a dielectric layer (not shown) can be present between the electrode structure 130 and the dielectric material 134. In example implementations, a thickness of this dielectric layer is approximately 10 nanometers or less (e.g., 10, 8, 5, or 2 nanometers). In general, the dielectric material 134 is at least partially covered by the electrode structure 130.

The substrate layer 302 includes one or more sublayers that can support passivation, temperature compensation, power handling, mode suppression, and so forth. As an example, the substrate layer 302 can include at least one compensation layer 314, at least one charge-trapping layer 316, at least one support layer 318, or some combination thereof. These sublayers can be considered part of the substrate layer 302 or their own separate layers.

The compensation layer 314 can provide temperature compensation to enable the surface-acoustic-wave filter 124 to achieve a target temperature coefficient of frequency based on the thickness of the piezoelectric layer 132. In some implementations, a thickness of the compensation layer 314 can be tailored to provide mode suppression (e.g., suppress the spurious plate mode). In example implementations, the compensation layer 314 can be implemented using at least one silicon dioxide (SiO2) layer, at least one doped silicon dioxide layer, at least one silicon nitride layer, at least one silicon oxynitride layer, or some combination thereof. In some applications, the substrate layer 302 may not include, for instance, the compensation layer 314 to reduce cost of the surface-acoustic-wave filter 124.

The charge-trapping layer 316 can trap induced charges at the interface between the compensation and support layer in order to, for example, suppress nonlinear substrate effects. The charge-trapping layer 316 can include at least one polysilicon (poly-Si) layer (e.g., a polycrystalline silicon layer or a multicrystalline silicon layer), at least one amorphous silicon layer, at least one silicon nitride (SiN) layer, at least one silicon oxynitride (SiON) layer, at least one aluminium nitride (AlN) layer, diamond-like carbon (DLC), diamond, or some combination thereof.

The support layer 318 can enable the acoustic wave to form across the surface of the piezoelectric layer 132 and reduce the amount of energy that leaks into the substrate layer 302. In some implementations, the support layer 318 can also act as a compensation layer 314. In general, the support layer 318 is composed of material that is non-conducting and provides isolation. For example, the support layer 318 can be formed using silicon (Si) material (e.g., a doped high-resistive silicon material), sapphire material (e.g., aluminium oxide ($Al_2O_3$)), silicon carbide (SiC) material, fused silica material, quartz, glass, diamond, or some combination thereof. In some implementations, the support layer 318 has a relatively similar thermal expansion coefficient (TEC) as the piezoelectric layer 132. The support layer 318 can also have a particular crystal orientation to support the suppression or attenuation of spurious modes.

In some aspects, the surface-acoustic-wave filter 124 can be considered a resonator. Sometimes the surface-acoustic-wave filter 124 can be connected to other resonators associated with different layer stacks than the surface-acoustic-wave filter 124. In other aspects, the surface-acoustic-wave filter 124 can be implemented as multiple interconnected resonators, which use the same layers (e.g., the piezoelectric layer 132 and/or the substrate layer 302). The electrode structure 130, the piezoelectric layer 132, and the dielectric material 134 are further described with respect to FIGS. 4-1 and 4-2.

Figure 4:
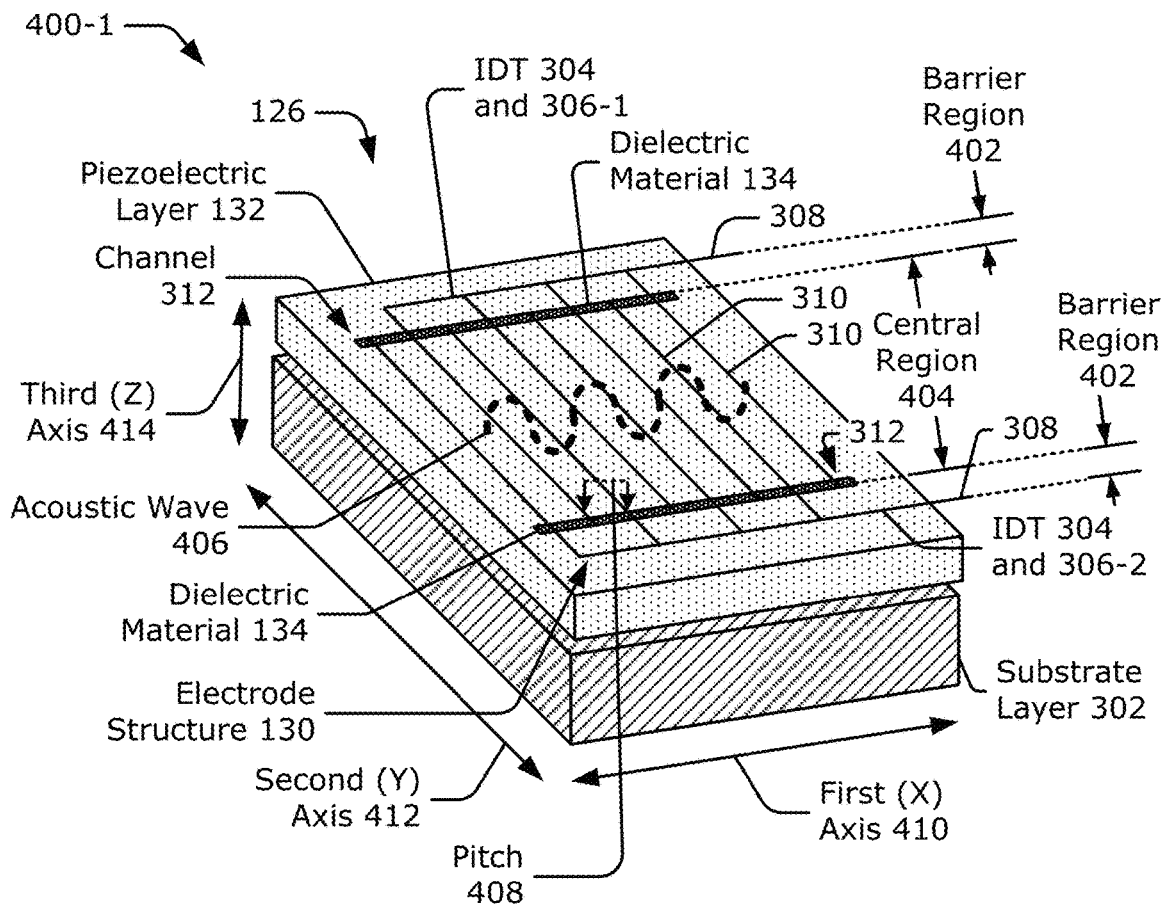
Figure 1:
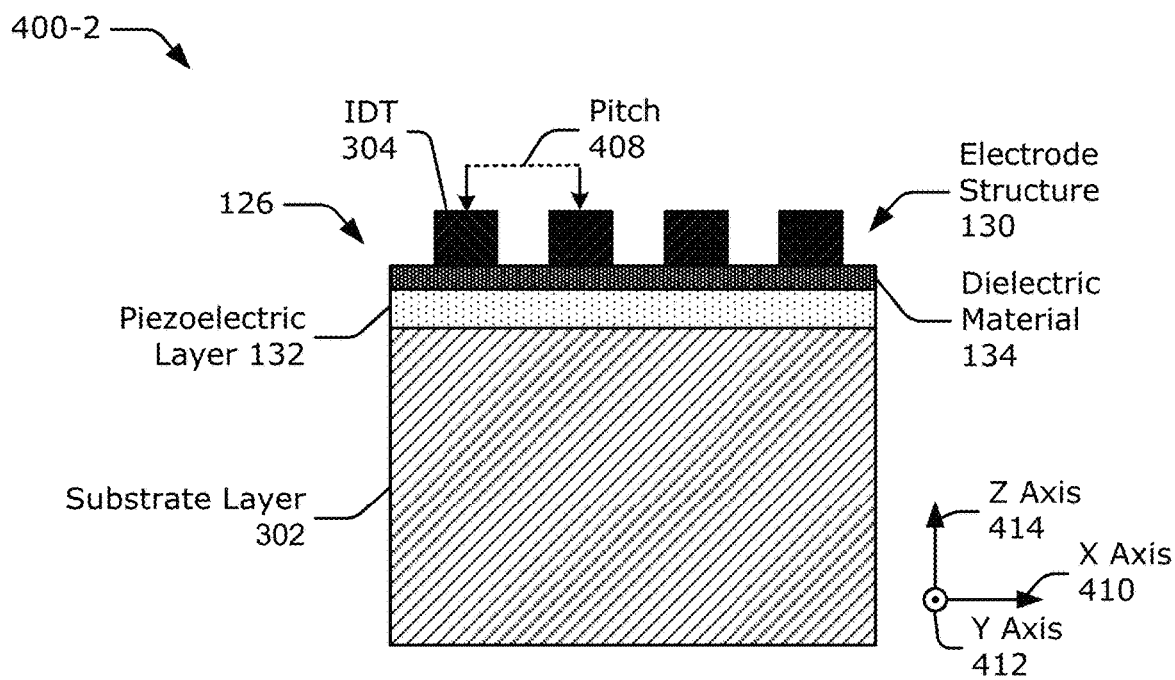
Figure 4:
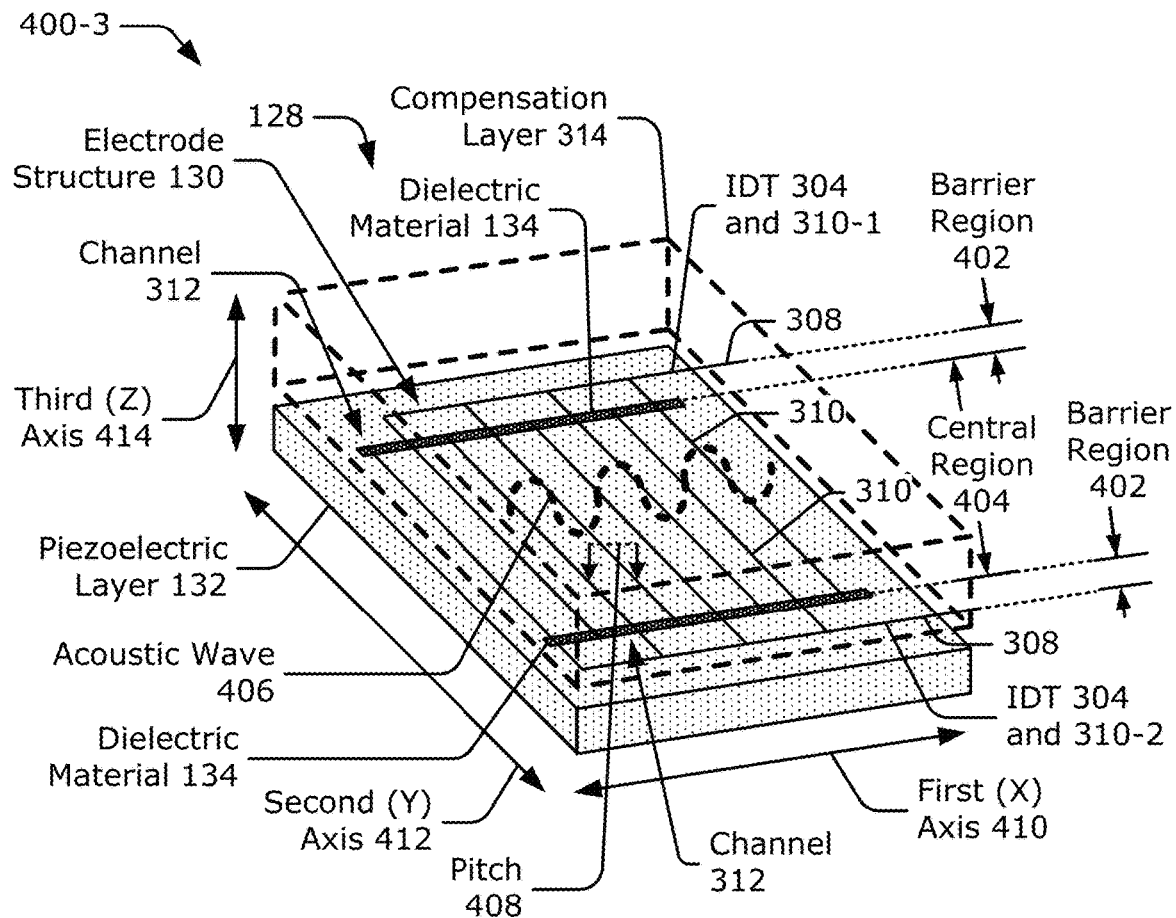
Figure 2:
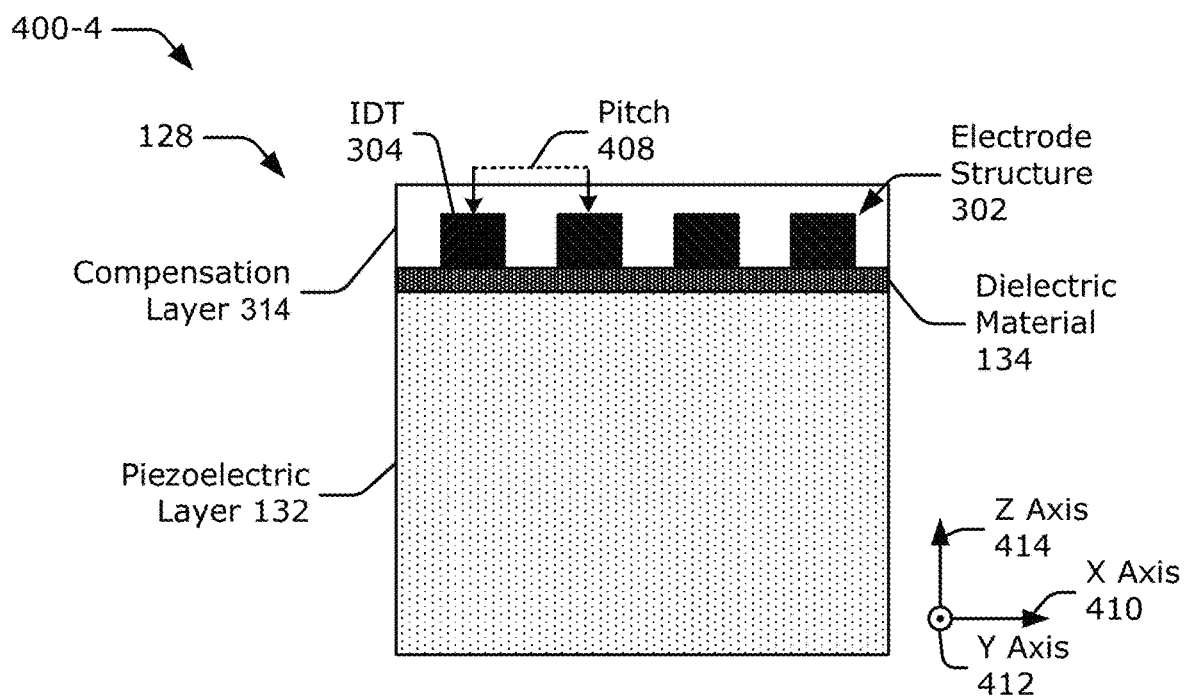

FIG. 4-1 illustrates an example implementation of the thin-film surface-acoustic-wave filter 126 with the dielectric material 134 disposed in the piezoelectric layer 132. A three-dimensional perspective view 400-1 of the thin-film surface-acoustic-wave filter 126 is shown at the top of FIG. 4-1, and a two-dimensional cross-section view 400-2 of the thin-film surface-acoustic-wave filter 126 is shown at the bottom of FIG. 4-1.

The thin-film surface-acoustic-wave filter 126 includes at least one electrode structure 130, at least one piezoelectric layer 132, and at least one substrate layer 302. The electrode structure 130 can include one or more interdigital transducers 304. In the depicted configuration shown in the two-dimensional cross-section view 400-2, the piezoelectric layer 132 is disposed between the electrode structure 130 and the substrate layer 302.

In the three-dimensional perspective view 400-1, the interdigital transducer 304 is shown to have the two comb-shaped structures 306-1 and 306-2 with fingers 310 extending from two busbars 308 towards each other. The fingers 310 are arranged in an interlocking manner in between the two busbars 308 of the interdigital transducer 304 (e.g., arranged in an interdigitated manner). In other words, the fingers 310 connected to a first busbar 308 extend towards a second busbar 308 but do not connect to the second busbar 308. As such, there is a barrier region 402 (e.g., a transversal gap region) between the ends of these fingers and the second busbar 308. Likewise, fingers 310 connected to the second busbar 308 extend towards the first busbar 308 but do not connect to the first busbar 308. There is therefore a barrier region 402 between the ends of these fingers 310 and the first busbar 308, as further described with respect to FIG. 5.

In the direction along the busbars 308, there is an overlap region including a central region 404 where a portion of one finger 310 overlaps with a portion of an adjacent finger 310. This central region 404, including the overlap, may be referred to as the aperture, track, or active region where electric fields are produced between fingers 310 to cause an acoustic wave 406 to form at least in this region of the piezoelectric layer 132.

A physical periodicity of the fingers 310 is referred to as a pitch 408 of the interdigital transducer 304. The pitch 408 may be indicated in various ways. For example, in certain aspects, the pitch 408 may correspond to a magnitude of a distance between adjacent fingers 310 of the interdigital transducer 304 in the central region 404. This distance may be defined, for example, as the distance between center points of each of the fingers 310. The distance may be generally measured between a right (or left) edge of one finger 310 and the right (or left) edge of an adjacent finger 310 when the fingers 310 have uniform widths. In certain aspects, an average of distances between adjacent fingers 310 of the interdigital transducer 304 may be used for the pitch 408. The frequency at which the piezoelectric layer 132 vibrates is a main-resonance frequency of the electrode structure 130. The frequency is determined at least in part by the pitch 408 of the interdigital transducer 304 and other properties of the thin-film surface-acoustic-wave filter 126.

In the three-dimensional perspective view 400-1, the thin-film surface-acoustic-wave filter 126 is defined by a first (X) axis 410, a second (Y) axis 412, and a third (Z) axis 414. The first axis 410 and the second axis 412 are parallel to a planar surface of the piezoelectric layer 132, and the second axis 412 is perpendicular to the first axis 410. The third axis 414 is normal (e.g., perpendicular or orthogonal) to the planar surface of the piezoelectric layer 132. The busbars 308 of the interdigital transducer 304 are oriented to be parallel to the first axis 410. The fingers 310 of the interdigital transducer 304 are orientated to be parallel to the second axis 412. Also, an orientation of the piezoelectric layer 132 causes the acoustic wave 406 to mainly form in a direction of the first axis 410. As such, the acoustic wave 406 forms in a direction that is substantially perpendicular or orthogonal to the direction of the fingers 310 of the interdigital transducer 304.

At least one channel 312 is formed or etched within a surface of the piezoelectric layer 132 that faces towards the electrode structure 130. In the example implementation shown in FIG. 4-1, the piezoelectric layer 132 has two channels 312, which are positioned proximate to outer boundaries or edges of the central region 404. The dielectric material 134 is disposed in the two channels 312. A surface of the dielectric material 134 that faces towards the electrode structure 130 can be substantially flush with the surface of the piezoelectric layer 132 that also faces towards the electrode structure 130. In some cases, a surface of the dielectric material 134 that faces away from the electrode structure 130 adheres to the surface of the piezoelectric layer 132 that faces towards the electrode structure 130. Another example type of surface-acoustic-wave filter 124 is further described with respect to FIG. 4-2.

FIG. 4-2 illustrates an example implementation of the high-quality temperature-compensated surface-acoustic-wave filter 128 with the dielectric material 134 disposed in the piezoelectric layer 132. A three-dimensional perspective view 400-3 of the high-quality temperature-compensated surface-acoustic-wave filter 128 is shown at the top of FIG. 4-2, and a two-dimensional cross-section view 400-4 of the high-quality temperature-compensated surface-acoustic-wave filter 128 is shown at the bottom of FIG. 4-2.

The high-quality temperature-compensated surface-acoustic-wave filter 128 includes at least one electrode structure 130, at least one piezoelectric layer 132, and at least one compensation layer 314. The compensation layer 314 can provide temperature compensation to enable the high-quality temperature-compensated surface-acoustic-wave filter 128 to achieve a target temperature coefficient of frequency. In example implementations, the compensation layer 314 can be implemented using at least one silicon dioxide layer.

In the depicted configuration shown in the two-dimensional cross-section view 400-4, the electrode structure 130 is disposed between the piezoelectric layer 132 and the compensation layer 314. The piezoelectric layer 132 can form a substrate of the high-quality temperature-compensated surface-acoustic-wave filter 128.

The electrode structure 130 of the high-quality temperature-compensated surface-acoustic-wave filter 128 can be similar to the electrode structure 130 described above with respect to the thin-film surface-acoustic-wave filter 126 of FIG. 4-1. Likewise, the piezoelectric layer 132 of the high-quality temperature-compensated surface-acoustic-wave filter 128 can be similar to the piezoelectric layer 132 described above with respect to the thin-film surface-acoustic-wave filter 126 of FIG. 4-1. The piezoelectric layer 132 of the high-quality temperature-compensated surface-acoustic-wave filter 128, however, can be thicker than the piezoelectric layer 132 of the thin-film surface-acoustic-wave filter 126 of FIG. 4-1. Similar to the thin-film surface-acoustic-wave filter 126 of FIG. 4-1, the high-quality temperature-compensated surface-acoustic-wave filter 128 of FIG. 4-2 can also include the barrier region 402 and the central region 404.

The high-quality temperature-compensated surface-acoustic-wave filter 128 can have at least one channel 312 formed or etched within a surface of the piezoelectric layer 132 that faces towards the electrode structure 130. In the example implementation shown in FIG. 4-2, the piezoelectric layer 132 has two channels, which are positioned proximate to outer boundaries or edges of the central region 404. The dielectric material 134 is disposed in the two channels 312. A surface of the dielectric material 134 that faces towards the electrode structure 130 can be substantially flush with the surface of the piezoelectric layer 132 that also faces towards the electrode structure 130. In some cases, a surface of the dielectric material 134 that faces away from the electrode structure 130 adheres to the surface of the piezoelectric layer 132 that faces towards the electrode structure 130.

For both the thin-film surface-acoustic-wave filter 126 and the high-quality temperature-compensated surface-acoustic-wave filter 128, a variety of properties associated with the dielectric material 134 (and the channel 312) can be tailored to achieve a target level of spurious-mode suppression for a particular range of frequencies. For instance, a density and/or stiffness of the dielectric material 134, a position of the dielectric material 134 (and channel 312 or multiple channels 312) within the central region 404, a length of the dielectric material 134 (and channel 312) along the first (X) axis 410, a width of the dielectric material 134 (and channel 312) along the second (Y) axis 412, and/or a thickness of the dielectric material 134 (e.g., a depth of the channel 312) along the third (Z) axis 414 can be designed to attenuate a transversal mode across a range of frequencies by a particular amount. In particular, the width of the dielectric material 134 can be based, at least in part, on the range of frequencies. Additionally, these properties can be tailored to provide a geometry that produces a velocity profile in accordance with a piston mode. For example, the thickness and/or width of the dielectric material 134 can be designed to realize a particular velocity within the trap region 506.

The thickness of the dielectric material 134 along the third (Z) axis 414 can be between approximately 5% and 100% of twice the pitch 408. For an example thin-film surface-acoustic-wave filter 126 or an example high-quality temperature-compensated surface-acoustic-wave filter 128, the thickness of the dielectric material 134 can be approximately 5%, 10%, 25%, 50%, 75%, 80%, or 100% the length of two times the pitch 408. In cases in which a thickness of the piezoelectric layer 132 is less than twice the pitch 408, the thickness of the dielectric material 134 can be less than or equal to the thickness of the piezoelectric layer 132. In general, the term "approximately" can mean that any of the thicknesses can be within +/−10% of a specified value or less (e.g., within +/−5%, +/−3%, or +/−2% of a specified value). Generally, increasing the thickness of the dielectric material 134 decreases the acoustic wave 406's velocity within the trap region 506. Various implementations of the channels 312 and the dielectric material 134 are further described with respect to FIGS. 6-9. The thin-film surface-acoustic-wave filter 126 of FIG. 4-1 and the high-quality temperature-compensated surface-acoustic-wave filter 128 of FIG. 4-2 can have similar operations, which are generally described below with respect to the surface-acoustic-wave filter 124.

During operation, the surface-acoustic-wave filter 124 (e.g., the thin-film surface-acoustic-wave filter 126 of FIG. 4-1 or the high-quality temperature-compensated surface-acoustic-wave filter 128 of FIG. 4-2) accepts a radio-frequency signal, such as the pre-filter transmit signal 224 or the pre-filter receive signal 230 shown in FIG. 2. The electrode structure 130 excites an acoustic wave 406 on the piezoelectric layer 132 using the inverse piezoelectric effect. For example, the interdigital transducer 304 in the electrode structure 130 generates an alternating electric field based on the accepted radio-frequency signal. The piezoelectric layer 132 enables the acoustic wave 406 to be formed in response to the alternating electric field generated by the interdigital transducer 304. In other words, the piezoelectric layer 132 causes, at least partially, the acoustic wave 406 to form responsive to electrical stimulation by one or more interdigital transducers 304.

The acoustic wave 406 propagates across the piezoelectric layer 132 and interacts with the interdigital transducer 304 or another interdigital transducer within the electrode structure 130 (not shown in FIG. 4-1 or 4-2). The acoustic wave 406 that propagates can be a standing wave. In some implementations, two reflectors within the electrode structure 130 cause the acoustic wave 406 to be formed as a standing wave across a portion of the piezoelectric layer 132. In other implementations, the acoustic wave 406 propagates across the piezoelectric layer 132 from the interdigital transducer 304 to another interdigital transducer (not shown).

Using the piezoelectric effect, the electrode structure 130 generates a filtered radio-frequency signal based on the propagated surface acoustic wave 406. In particular, the piezoelectric layer 132 generates an alternating electric field due to the mechanical stress generated by the propagation of the acoustic wave 406. The alternating electric field induces an alternating current in the other interdigital transducer or the interdigital transducer 304. This alternating current forms the filtered radio-frequency signal, which is provided at an output of the surface-acoustic-wave filter 124. The filtered radio-frequency signal can include the filtered transmit signal 226 or the filtered receive signal 232 of FIG. 2.

It should be appreciated that while a certain number of fingers are illustrated in FIGS. 4-1 and 4-2, the number of actual fingers and lengths and width of the fingers and busbars may be different in an actual implementation. Such parameters depend on the particular application and desired filter characteristics. In addition, the thin-film surface-acoustic-wave filter 126 or high-quality temperature-compensated surface-acoustic-wave filter 128 can include multiple interconnected electrode structures each including multiple interdigital transducers 304 to achieve a desired passband (e.g., multiple interconnected resonators or interdigital transducers 304 in series or parallel connections to form a desired filter transfer function).

Although not explicitly shown, the electrode structure 130 can also include two or more reflectors. In an example implementation, the interdigital transducer 304 is arranged between two reflectors (not shown), which reflect the acoustic wave back towards the interdigital transducer 304. Each reflector within the electrode structure 130 can have two busbars and a grating structure of conductive fingers that each connect to both busbars. In some implementations, the pitch of the reflector can be similar to or the same as the pitch 408 of the interdigital transducer 304 to reflect the acoustic wave 406 in the resonant frequency range.

Figure 5:
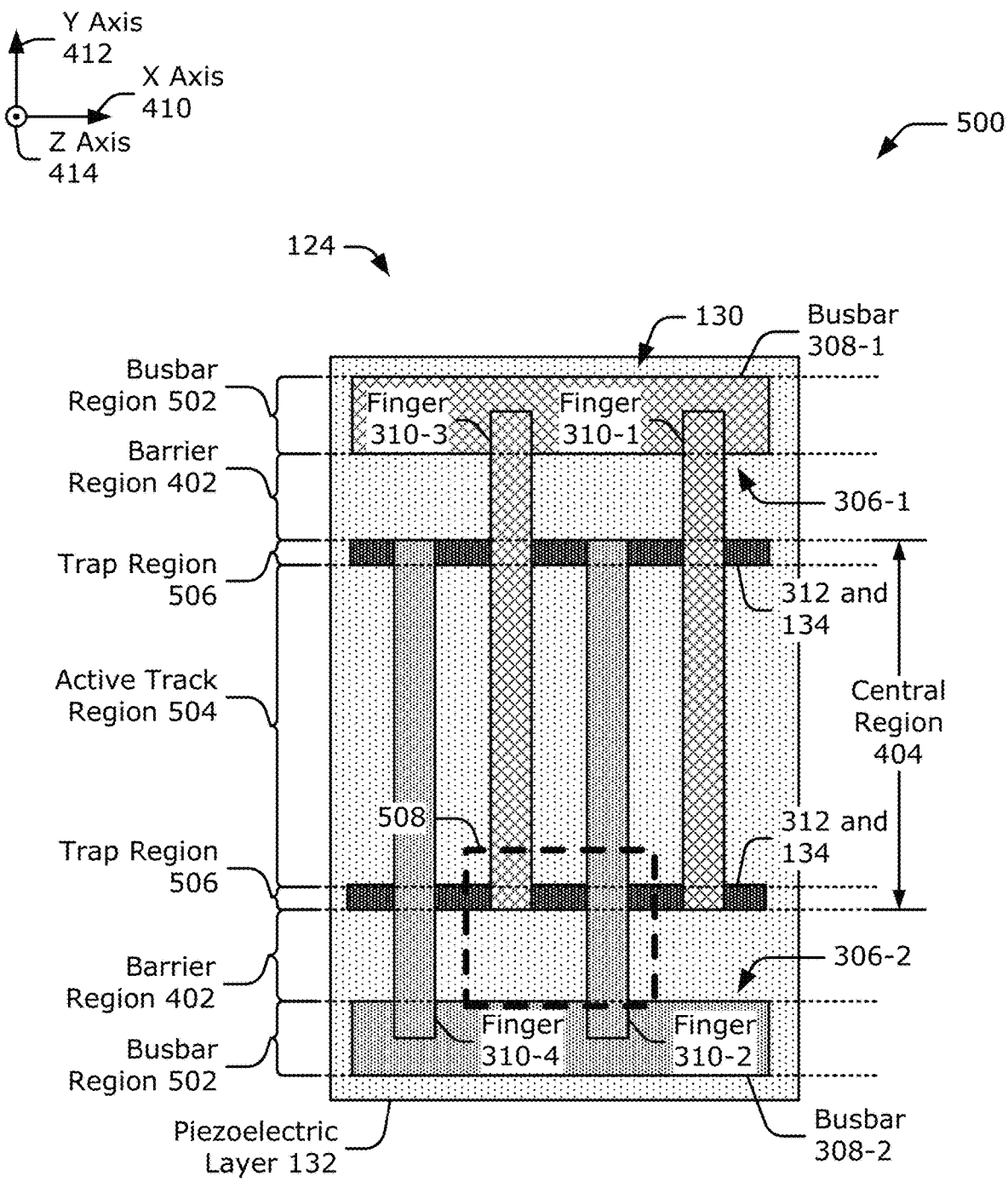
FIG. 5 illustrates an example electrode structure of a surface-acoustic-wave filter with dielectric material disposed in a piezoelectric layer.

FIG. 5 illustrates an example electrode structure 130 of the surface-acoustic-wave filter 124 with dielectric material 134 disposed in the piezoelectric layer 132. The surface-acoustic-wave filter 124 of FIG. 5 can be the thin-film surface-acoustic-wave filter 126 of FIG. 4-1 or the high-quality temperature-compensated surface-acoustic-wave filter 128 of FIG. 4-2.

As shown in a two-dimensional top-down view 500 of the surface-acoustic-wave filter 124, the electrode structure 130 of the surface-acoustic-wave filter 124 includes a first busbar 308-1, a second busbar 308-2, and fingers 310-1, 310-2, 310-3, and 310-4. The first busbar 308-1 and the fingers 310-1 and 310-3 form at least a portion of the first comb-shaped structure 306-1. The fingers 310-1 and 310-3 are connected to the first busbar 308-1 and extend along the second (Y) axis 412 towards the second busbar 308-2 without connecting to the second busbar 308-2. The second busbar 308-2 and the fingers 310-2 and 310-4 form at least a portion of the second comb-shaped structure 306-2. The fingers 310-2 and 310-4 are connected to the second busbar 308-2 and extend along the second (Y) axis 412 towards the first busbar 308-1 without connecting to the first busbar 308-1.

The surface-acoustic-wave filter 124 includes multiple distinct regions along the second (Y) axis 412. These regions are defined, at least in part, based on a physical layout of the electrode structure 130. The regions include a busbar region 502, the barrier region 402, and the central region 404. The busbar region 502 includes the busbars 308-1 and 308-2 and extends along portions of the second (Y) axis 412 that correspond with the widths of the busbars 308-1 and 308-2. In this case, two busbar regions 502 are shown to be associated with the two busbars 308-1 and 308-2, respectively.

The barrier region 402 is present between the central region 404 and the busbar region 502. In particular, the barrier region 402 includes portions of the second (Y) axis 412 that extend between one busbar 308 and the ends of fingers 310 associated with another busbar 308 (e.g., an opposite busbar). For example, a first barrier region 402 exists between the first busbar 308-1 and the ends of fingers 310-2 and 310-4, which are associated with the second busbar 308-2. A second barrier region 402 exists between the second busbar 308-2 and ends of fingers 310-1 and 310-3, which are associated with the first busbar 308-1.

The central region 404 is defined by the overlap of fingers 310-1 to 310-4 across the first (X) axis 410. As depicted in the top-down view 500, the central region 404 includes at least one active track region 504 and at least one trap region 506. The trap region 506 is present between the barrier region 402 and the active track region 504. In this way, the trap region 506 exists at the outer boundaries or outer edges of the central region 404. The channels 312 and the dielectric material 134 are positioned within the trap region 506. As such, the fingers 310-1 to 310-4 of the electrode structure 130 at least partially cover the dielectric material 134 and the channel 312. In general, the main or fundamental mode of the surface-acoustic-wave filter 124 is designed to propagate within the active track region 504. The active track region 504 can also be referred to as a central excitation area.

With the dielectric material 132 disposed in the piezoelectric layer 132, the structural characteristics of the piezoelectric layer 132 within the trap region 506 can vary from the other regions, including the active track region 504. This variation causes the acoustic wave 406 (of FIG. 4-1 or 4-2) to have a lower velocity (e.g., a lower transversal velocity) within the trap region 506 than within the active track region 504. By disposing the dielectric material 132 within the piezoelectric layer 132, a velocity profile of the surface-acoustic-wave filter 124 can be designed to reduce (suppress) spurious transversal modes and promote excitation of the main or fundamental wave mode.

The velocity profile indicates velocities (e.g., wave velocities) of each region of the surface-acoustic-wave filter 124. In an example implementation, the velocity of the acoustic wave 406 is higher within the busbar region 502 and the barrier region 402 in comparison to the central region 404. In general, the acoustic wave 406 can readily propagate in regions in which the velocity is lower, such as within the central region 404. The relatively higher velocity within the barrier region 402 and the busbar region 502 effectively forms a barrier, which isolates the central region 404 and reduces leakage (e.g., loss) within the surface-acoustic-wave filter 124.

Within the central region 404, the velocity is lower within the trap region 506 in comparison to the active track region 504. The lower velocity within the trap region 506 can shape the transversal profile (e.g., amplitude) of the fundamental mode. As an example, a difference in velocities between the active track region 504 and the trap region 506 can be on the order of tens or hundreds of meters per second (m/s).

A mode profile of the surface-acoustic-wave filter indicates the amplitude of the fundamental wave mode across the different regions. In this example implementation, the mode profile has a rectangular or pulse shape, which corresponds to a piston mode in which spurious transversal modes are substantially suppressed (e.g., attenuated). The piston mode is characterized by the amplitude being generally flat (e.g., the same) across the active track region 504 and higher within the active track region 504 in comparison to the busbar and barrier regions 502 and 402. To realize the piston mode and suppress spurious transversal modes, disposing the dielectric material 134 in the piezoelectric layer 132 increases the mass loading that is applied to the piezoelectric layer 132 within the trap region 506.

In some implementations, a width of the trap region 506 along the second (Y) axis 412 (e.g., a lateral dimension or transversal dimension of the trap region 506) can be between approximately 10% to 300% of a wavelength of the acoustic wave 406 along the first (X) axis 410. For example, the width of the trap region 506 can be between approximately 25% and 100% of the wavelength of the acoustic wave 406. The width of the trap region 506 along the second (Y) axis 412 can also be specified with respect to the pitch 408 (of FIG. 4-1 or 4-2) of the electrode structure 130. In example implementations, the width of the trap region 506 can be between approximately 30% and 200% of the pitch 408 (of FIG. 4-1 or 4-2) of the electrode structure 130. For example, the width of the trap region 506 can be approximately 30%, 50%, 100%, or 200% of the pitch 408. As another example, the width of the trap region 506 can be between approximately 30% and 70% of the pitch 408. In general, the term "approximately" can mean that any of the widths can be within +/−10% of a specified value or less (e.g., within +/−5%, +/−3%, or +/−2% of a specified value).

For clarity, the regions of the surface-acoustic-wave filter 124 are not necessarily drawn to scale in the top-down view 500. Further, each region may have some variability that deviates from the illustrated proportions or widths, including variabilities caused by constraints of a given manufacturing technology. For example, the trap region 506 may extend beyond the ends of fingers over which the trap region 506 is disposed. One of ordinary skill in the art can appreciate that these dimensions can vary for other example implementations of the surface-acoustic-wave filter 124.

In some aspects, the surface-acoustic-wave filter 124 is implemented using additional piston-mode techniques that customize a geometry of the electrode structure 130. As an example, the fingers 310 within the electrode structure 130 can have varying widths or heights across the length of the fingers 310. In particular, a finger 310 can have a wider and/or taller profile (e.g., include a hammerhead or a dot, respectively) within the trap region 506 relative to the active track region 504. The wider and/or taller profile can be realized by applying conducting material, such as metal, and/or a dielectric material. This additional material increases a mass of the fingers 310 within the trap region 506 relative to the active track region 504.

A portion 508 of the electrode structure 130 is further described with respect to various implementations of the dielectric material 134 in FIGS. 6-9. As shown in FIG. 5, the portion 508 includes a "lower" portion (as depicted on the drawing sheet) of the surface-acoustic-wave filter 124. In particular, the portion 508 includes the trap region 506, the barrier region 402, and a portion of the busbar region 502 that is "below" (as depicted on the drawing sheet) the active track region 504. Although the portion 508 is explicitly depicted in FIGS. 6-9, an "upper" portion of the surface-acoustic-wave filter 124 (e.g., the trap region 506, the barrier region 402, and a portion of the busbar region 502 that is "above" the active track region 504) can have a similar configuration as the portion 508. Example configurations of the channel 312 and the dielectric material 134 are further described with respect to FIGS. 6-9.

FIG. 6 illustrates a first example implementation of the surface-acoustic-wave filter 124 with the dielectric material 134 disposed in the piezoelectric layer 132. A three-dimensional perspective view 600-1 of the portion 508 of the surface-acoustic-wave filter 124 is shown at the top of FIG. 6, a two-dimensional cross-section view 600-2 of the surface-acoustic-wave filter 124 is shown at the middle of FIG. 6, and a two-dimensional top-down view 600-3 of the surface-acoustic-wave filter 124 is shown at the bottom of FIG. 6.

In the portion 508 illustrated in the three-dimensional perspective view 600-1, the piezoelectric layer 132 has one channel 312 positioned within the trap region 506 (e.g., within one of the trap regions 506 of FIG. 5). In particular, the channel 312 is positioned proximate to an end of the finger 310-3 and a beginning of the finger 310-2. The channel 312 is filled with the dielectric material 134. As shown in the cross-section view 600-2 and the top-down view 600-3, the piezoelectric layer 132 can also include another channel 312 within the other trap region 506. Each channel 312 has a longitudinal axis that is substantially parallel to the first (X) axis (e.g., the direction of acoustic-wave propagation) and substantially perpendicular to the longitudinal axes of the fingers 310. As shown in the top-down view 600-3, the fingers 310 of the electrode structure 130 partially cover the dielectric material 134. As such, some of the dielectric material 134 is exposed.

The implementation shown in FIG. 6 can realize a target amount of spurious-mode suppression for some frequency ranges, such as a low-band frequency range, a mid-band frequency range, or a high-band frequency range. The low-band frequency range can include frequencies below one gigahertz (e.g., long-term evolution (LTE) frequency bands 28 or 71). The mid-band and high-band frequency ranges can include frequencies between one and three gigahertz (e.g., LTE frequency band 41). Multiple channels 312 in the piezoelectric layer 312 within the trap region 506 can also be implemented to achieve target levels of spurious-mode suppression for higher frequency bands (e.g., frequencies between three and six gigahertz (e.g., 5th-generation New Radio (5G NR) frequency bands n77 and n79)) as further described with respect to FIG. 7.

Figure 7:
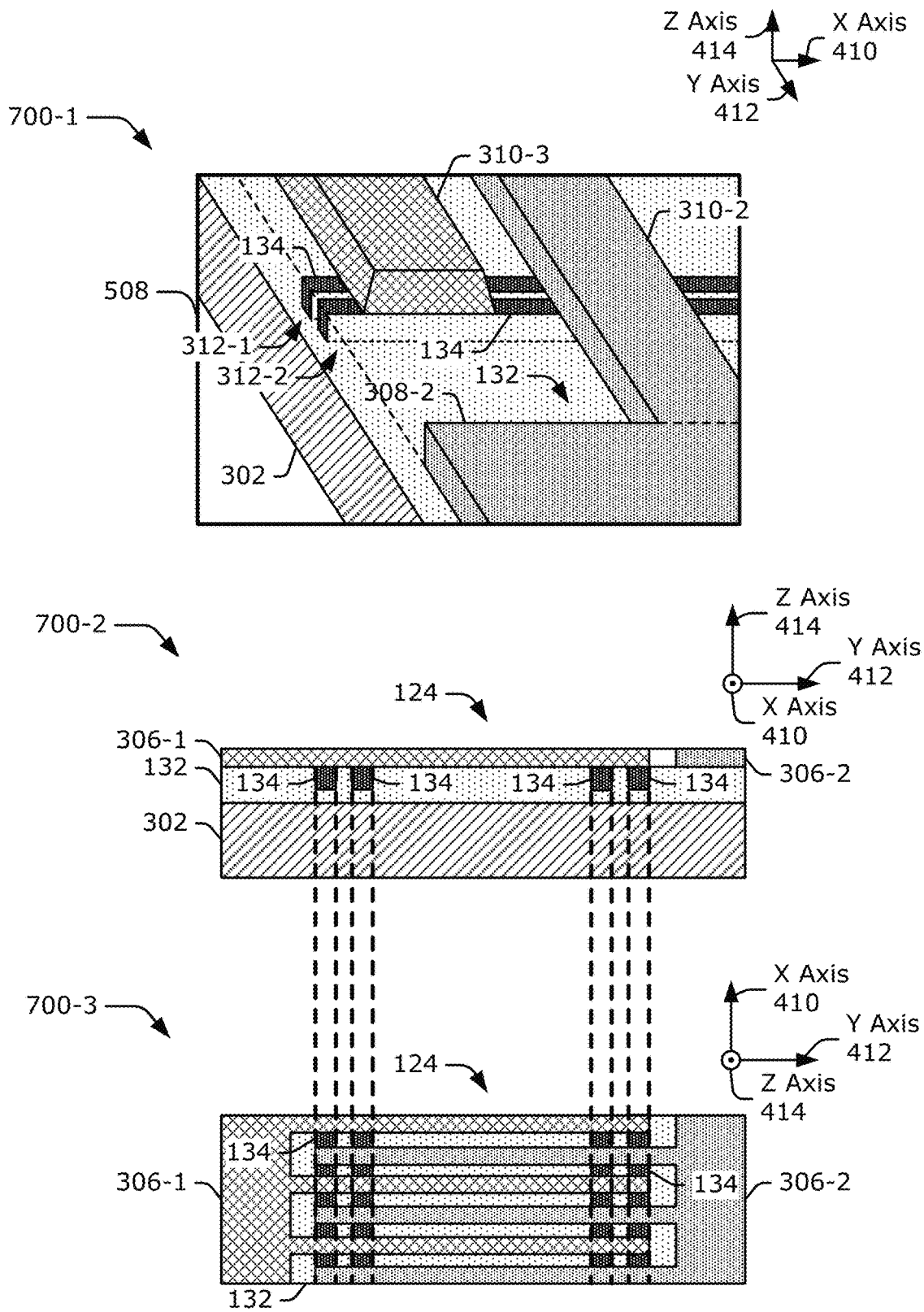
FIG. 7 illustrates a second example implementation of a surface-acoustic-wave filter with dielectric material disposed in a piezoelectric layer.

FIG. 7 illustrates a second example implementation of the surface-acoustic-wave filter 124 with the dielectric material 134 disposed in the piezoelectric layer 132. A three-dimensional perspective view 700-1 of the portion 508 of the surface-acoustic-wave filter 124 is shown at the top of FIG. 7, a two-dimensional cross-section view 700-2 of the surface-acoustic-wave filter 124 is shown at the middle of FIG. 7, and a two-dimensional top-down view 700-3 of the surface-acoustic-wave filter 124 is shown at the bottom of FIG. 7.

In the portion 508 illustrated in the three-dimensional perspective view 700-1, the piezoelectric layer 132 has two channels 312-1 and 312-2 positioned within the trap region 506 (e.g., positioned within one of the trap regions 506 of FIG. 5 or positioned proximate to a same boundary of the active track region 504). The two channels 312-1 and 312-2 can be substantially parallel to each other. The channels 312-1 and 312-2 are filled with the dielectric material 134.

As shown in the cross-section view 700-2 and the top-down view 700-3, the piezoelectric layer 132 can also include another set of parallel channels 312 within the other trap region 506. Each channel 312 has a longitudinal axis that is substantially parallel to the first (X) axis (e.g., the direction of acoustic-wave propagation) and substantially perpendicular to the longitudinal axes of the fingers 310. As shown in the top-down view 700-3, the fingers 310 of the electrode structure 130 partially cover the dielectric material 134 disposed in each channel 312. Some of the dielectric material 134 is exposed.

In general, the piezoelectric layer 132 can be implemented with any quantity of channels 312 within each trap region 506 (e.g., one, two, three, or four channels 312). Each channel 312 provides another degree of freedom to realize a desired level of spurious-mode suppression performance. With this design, the surface-acoustic-wave filter 124 can achieve the desired level of spurious-mode suppression performance for challenging frequency bands, including ultra-high frequency bands.

In the implementations shown in FIGS. 6 and 7, the channel 312 is implemented as a continuous channel that spans a track length of the surface-acoustic-wave filter 124 (e.g., spans between outer fingers 310 of the electrode structure 130 along the first (X) axis 410). In alternative implementations, the channel 312 can instead be implemented using multiple segmented channels that are approximately parallel to the first (X) axis 410, as further described with respect to FIGS. 8 and 9.

Figure 8:
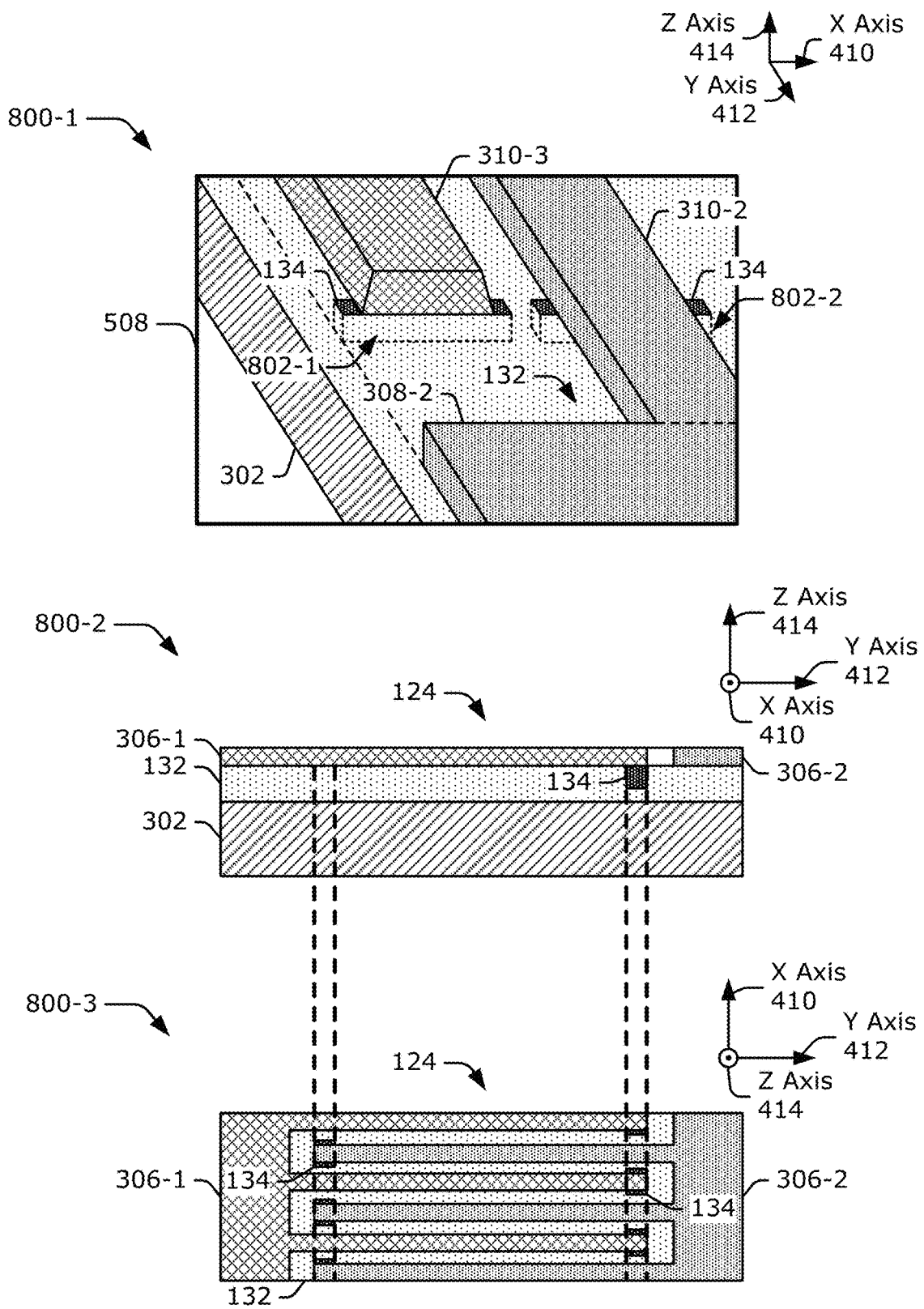
FIG. 8 illustrates a third example implementation of a surface-acoustic-wave filter with dielectric material disposed in a piezoelectric layer.

FIG. 8 illustrates a third example implementation of the surface-acoustic-wave filter 124 with the dielectric material 134 disposed in the piezoelectric layer 132. A three-dimensional perspective view 800-1 of the portion 508 of the surface-acoustic-wave filter 124 is shown at the top of FIG. 8, a two-dimensional cross-section view 800-2 of the surface-acoustic-wave filter 124 is shown at the middle of FIG. 8, and a two-dimensional top-down view 800-3 of the surface-acoustic-wave filter 124 is shown at the bottom of FIG. 8.

In the portion 508 illustrated in the three-dimensional perspective view 800-1, the piezoelectric layer 132 has multiple segmented channels 802 positioned within the trap region 506 along the first (X) axis 410 (e.g., positioned within one of the trap regions 506 of FIG. 5 or positioned proximate to a same boundary of the active track region 504). For example, the piezoelectric layer 132 includes a first segmented channel 802-1 positioned "below" the finger 310-3 and a second segmented channel 802-2 positioned "below" the finger 310-2. In some cases, the segmented channels 802 are positioned proximate to the ends of the fingers 310. Optionally, additional segmented channels 802 can be placed proximate to the beginning of the fingers 310. In general, each segmented channel 802 can be at least partially covered by a corresponding finger 310 of the electrode structure 130. Adjacent segmented channels 802 are physically separated from each other along the first (X) axis 410. The longitudinal axes of the segmented channels 802 can be substantially parallel to the first (X) axis (e.g., the direction of acoustic-wave propagation) and substantially perpendicular to the longitudinal axes of the fingers 310.

As shown in the top-down view 800-3, the piezoelectric layer 132 can also include other segmented channels 802 within the other trap region 506. The fingers 310 of the electrode structure 130 partially cover the dielectric material 134. As such, some of the dielectric material 134 is exposed. In other words, lengths of the segmented channels 802 along the first (X) axis 410 are greater than widths of the fingers 310 along the first (X) axis 410. In other implementations, the fingers 310 of the electrode structure 130 fully cover the dielectric material 134, as further described with respect to FIG. 9.

Figure 9:
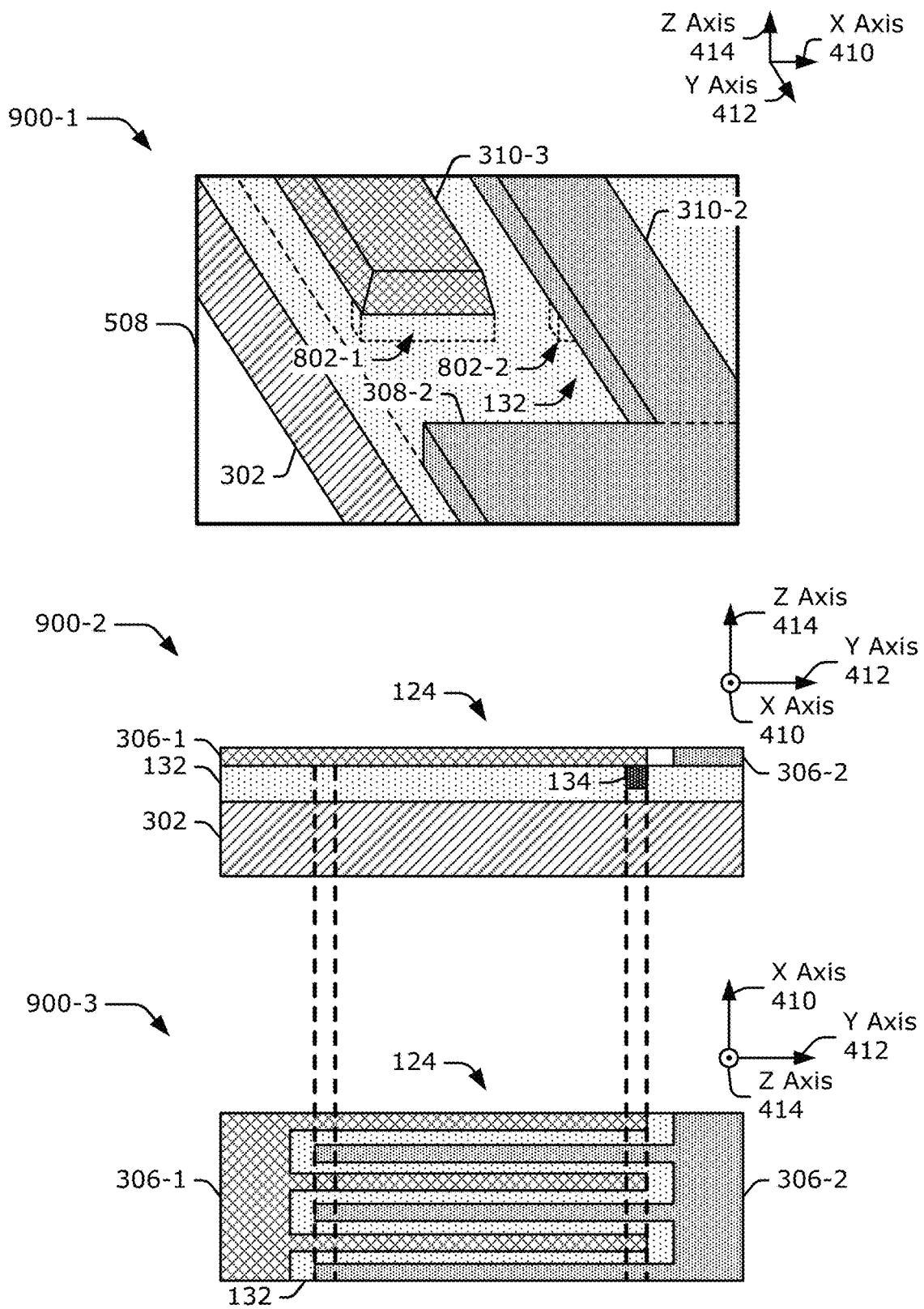
FIG. 9 illustrates a fourth example implementation of a surface-acoustic-wave filter with dielectric material disposed in a piezoelectric layer.

FIG. 9 illustrates a fourth example implementation of the surface-acoustic-wave filter 124 with the dielectric material 134 disposed in the piezoelectric layer 132. A three-dimensional perspective view 900-1 of the portion 508 of the surface-acoustic-wave filter 124 is shown at the top of FIG. 9, a two-dimensional cross-section view 900-2 of the surface-acoustic-wave filter 124 is shown at the middle of FIG. 9, and a two-dimensional top-down view 900-3 of the surface-acoustic-wave filter 124 is shown at the bottom of FIG. 9.

In the portion 508 illustrated in the three-dimensional perspective view 900-1, the piezoelectric layer 132 has multiple segmented channels 802 positioned within the trap region 506 along the first (X) axis 410 (e.g., positioned within one of the trap regions 506 of FIG. 5 or positioned proximate to a same boundary of the active track region 504). For example, the piezoelectric layer 132 includes a first segmented channel 802-1 positioned "below" the finger 310-3 and a second segmented channel 802-2 positioned "below" the finger 310-2. In some cases, the segmented channels 802 are positioned proximate to the ends of the fingers 310. Optionally, additional segmented channels 802 can be placed proximate to the beginning of the fingers 310. Adjacent segmented channels 802 are physically separated from each other along the first (X) axis 410. The longitudinal axes of the segmented channels 802 can be substantially parallel to the first (X) axis (e.g., the direction of acoustic-wave propagation) and substantially perpendicular to the longitudinal axes of the fingers 310.

As shown in the three-dimensional perspective view 900-1 and the top-down view 900-3, the fingers 310 of the electrode structure 130 fully cover the dielectric material 134. As such, the dielectric material 134 is not exposed. In other words, lengths of the segmented channels 802 along the first (X) axis 410 are less than widths of the fingers 310 along the first (X) axis 410.

One of ordinary skill in the art can appreciate the variety of other configurations for which the dielectric material 134 can be partially embedded in the piezoelectric layer 132. Some implementations of the piezoelectric layer 132 can have some combination of the designs described in FIGS. 6-9. For example, the surface-acoustic-wave filter 124 can include a trap region 506 with a first set of segmented channels 802 as described in FIG. 8 or 9 and a second set of segmented channels 802 that is substantially parallel to the first set of segmented channels along the first (X) axis 410 and offset from the first set of segmented channels along the second (Y) axis 412. Explained another way, the first set of segmented channels 802 and the second set of segmented channels 802 can be positioned proximate to a same boundary of the active track region 504. As another example, the surface-acoustic-wave filter 124 can include more than two parallel channels 312 within a trap region 506 (e.g., positioned within one of the trap regions 506 of FIG. 5 or positioned proximate to a same boundary of the active track region 504), such as three or four channels 312.

Although the segmented channels 802 of FIGS. 8 and 9 are shown to be aligned along a same axis that is substantially parallel to the first (X) axis 410, other implementations of the segmented channels 802 can apply an offset along the second (Y) axis 412 for different sets of the segmented channels 802. For example, a first set of the segmented channels 802 can be aligned along a first axis that is substantially parallel to the first (X) axis 410 and intersects the second (Y) axis 412 at a first point. A second set of the segmented channels 802 can be aligned along a second axis that is substantially parallel to the first (X) axis 410 and intersects the second (Y) axis 412 at a second point, which differs from the first point.

Although the surface-acoustic-wave filters 124 of FIGS. 6-9 are illustrated as thin-film surface-acoustic-wave filters 126 with a substrate layer 302, other implementations of the surface-acoustic-wave filter 124 are also possible. For example, the surface-acoustic-wave filters 124 of FIGS. 6-9 can be implemented as high-quality temperature-compensated surface-acoustic-wave filters 128 with a piezoelectric layer 132 that functions as the substrate layer 302.

Figure 10:
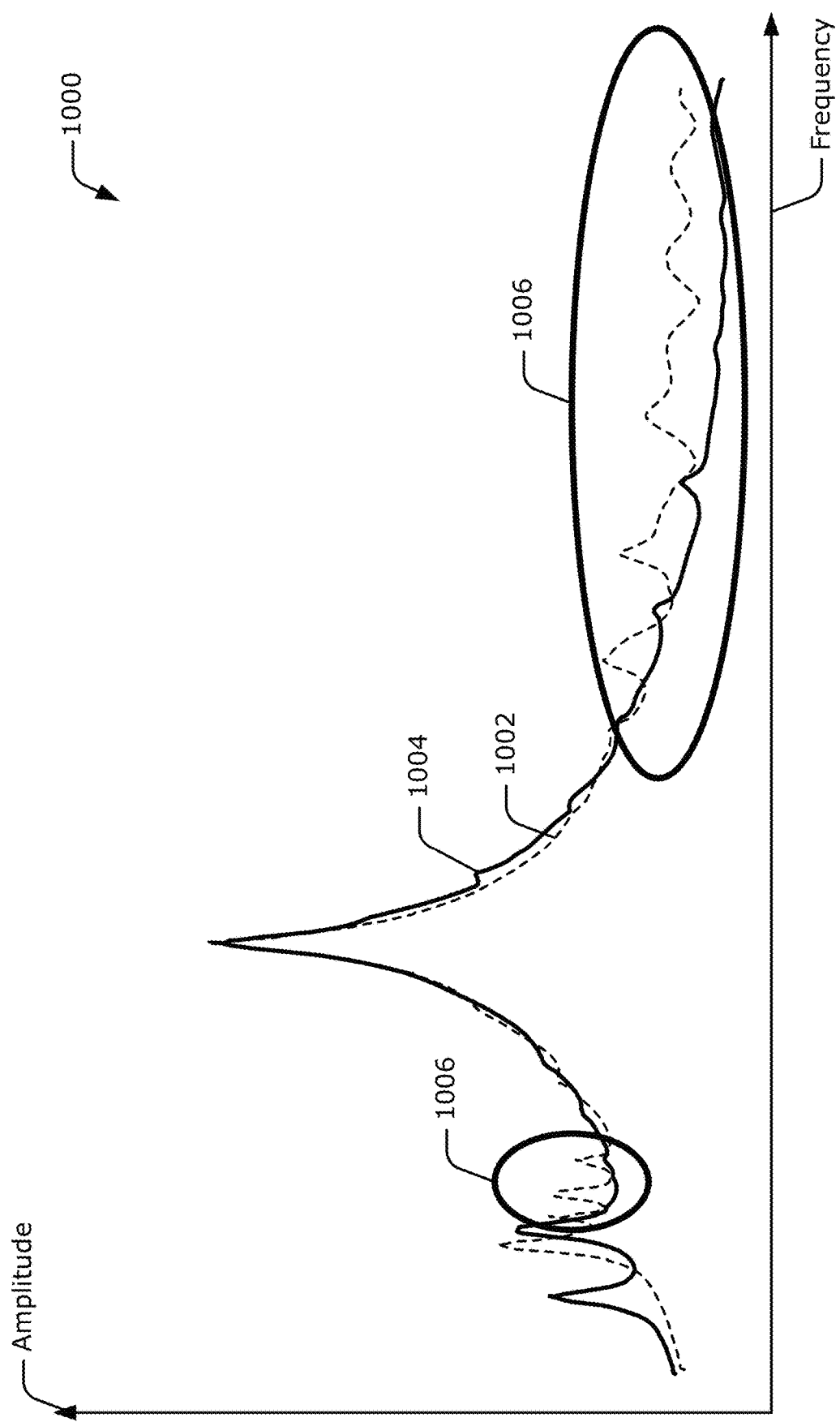
FIG. 10 illustrates example frequency responses for implementations of a surface-acoustic-wave filter that does and does not include dielectric material disposed in a piezoelectric layer.

FIG. 10 illustrates example frequency responses for implementations of a surface-acoustic-wave filter 124 that does and does not include the dielectric material 134 disposed in the piezoelectric layer 132. A graph 1000 depicts a frequency response 1002 of another surface-acoustic-wave filter that does not include the dielectric material 134 disposed in the piezoelectric layer 132. Instead of the dielectric material 134 disposed in the piezoelectric layer 132, the other surface-acoustic-wave filter includes a dielectric bar that is disposed across fingers of the electrode structure. The dielectric bar enables the other surface-acoustic-wave filter to operate in the piston mode.

The graph 1000 also depicts a frequency response 1004 of the surface-acoustic-wave filter 124, which includes the dielectric material 134 disposed in the piezoelectric layer 132. Due to the existence of the dielectric material 134, the frequency response 1004 of the surface-acoustic-wave filter 124 can attenuate spurious modes by a greater amount than the other surface-acoustic-wave filter, as shown at 1006. In some cases, this attenuation can be on the order of a few decibels (dB) or more (e.g., approximately 2, 3, 5, 8, or 10 dB). In general, the term "approximately" can mean that the attenuation can be within +/−10% of a specified value or less (e.g., within +/−5%, +/−3%, or +/−2% of a specified value).

Figure 11:
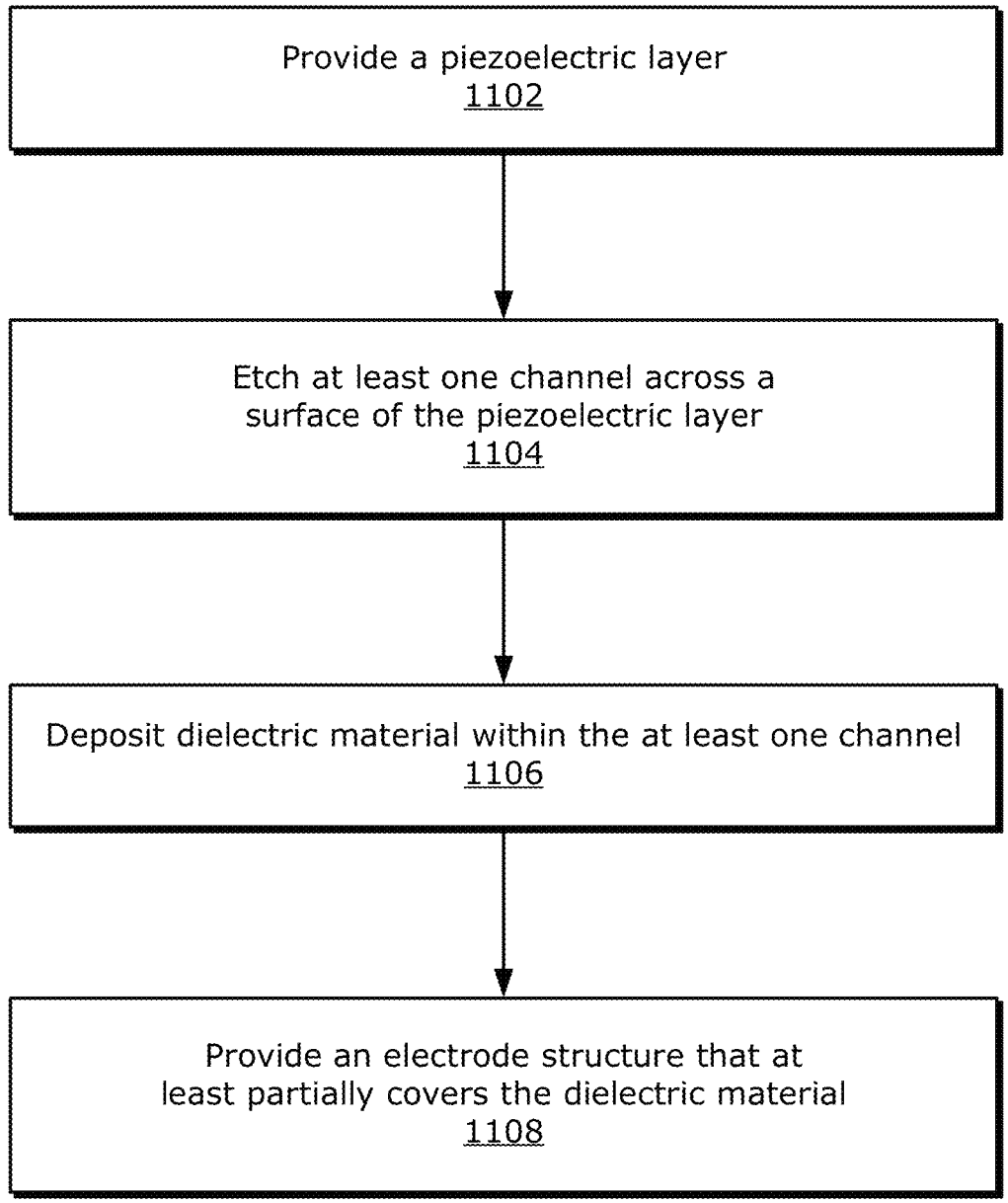
FIG. 11 is a flow diagram illustrating an example process for manufacturing a surface-acoustic-wave filter having dielectric material disposed in a piezoelectric layer.

FIG. 11 is a flow diagram illustrating an example process 1100 for manufacturing a surface-acoustic-wave filter 124 with dielectric material disposed in a piezoelectric layer. The process 1100 is described in the form of a set of blocks 1102-1108 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100, or an alternative process. Operations represented by the illustrated blocks of the process 1100 may be performed to manufacture the surface-acoustic-wave filter 124 (e.g., of FIGS. 1 to 3). More specifically, the operations of the process 1100 may be performed, at least in part, to dispose dielectric material 134 in a piezoelectric layer 132 of a surface-acoustic-wave filter 124 (e.g., of FIGS. 6-9).

At 1102, a piezoelectric layer is provided. For example, the manufacturing process provides the piezoelectric layer 132. The piezoelectric layer 132 can be implemented using various materials, such as lithium niobate, lithium tantalate, quartz, aluminium nitride, aluminium scandium nitride, or some combination thereof.

At 1104, at least one channel is etched across a surface of the piezoelectric layer. For example, the manufacturing process etches at least one channel 312 across a surface of the piezoelectric layer 132. The channel 312 can correspond to a continuous channel that spans the track length of the surface-acoustic-wave filter 124 proximate to a boundary of the active track region 504, as shown in FIG. 6 or 7. Alternatively, the channel 312 can correspond to one of multiple segmented channels 802 that are positioned along the track length proximate to a boundary of the active track region 504, as shown in FIG. 8 or 9.

In some implementations, multiple channels 312 are etched across the surface of the piezoelectric layer 132. The multiple channels 312 can be positioned in a same trap region 506 (e.g., proximate to a same boundary of the active track region 504) or in different trap regions 506 (e.g., proximate to different boundaries of the active track region 504). Properties of the channel 312 (e.g., position, length, width, or depth) can be tailored to realize a particular level of spurious-mode suppression. In some implementations, the piezoelectric layer 132 is formed to have a channel 312 therein.

At 1106, dielectric material is deposited within the at least one channel. For example, the manufacturing process deposits the dielectric material 134 within the at least one channel 312. In some cases, the manufacturing process fills the at least one channel 312 with the dielectric material 134 such that a surface of the dielectric material 134 is substantially flush with the surface of the piezoelectric layer 132. The dielectric material 134 can include tantalum oxide, silicon oxide, silicon dioxide, silicon nitride, hafnium oxide, aluminum oxide, tungsten trioxide, niobium pentoxide, or some combination or doped version thereof. The density and/or stiffness of the dielectric material 134 can be tailored to realize a particular level of spurious-mode suppression.

At 1108, an electrode structure that at least partially covers the dielectric material is provided. For example, the manufacturing process provides the electrode structure 130, which at least partially covers the dielectric material 134. The electrode structure 130 can partially cover the dielectric material 134, as shown in FIGS. 6-8, or fully cover the dielectric material 134, as shown in FIG. 9. In some implementations, the electrode structure 130 is in physical contact with the dielectric material 134 or separated by another dielectric layer.

Some aspects are described below.

Aspect 1: An apparatus comprising:
a surface-acoustic-wave filter comprising:
   a piezoelectric layer having at least one channel;
   an electrode structure; and
   dielectric material disposed in the at least one channel of the piezoelectric layer, the dielectric material at least partially covered by the electrode structure.

Aspect 2: The apparatus of aspect 1, wherein:
the electrode structure comprises:
   a first busbar and a second busbar;
   a first set of fingers extending from the first busbar toward the second busbar; and
   a second set of fingers extending from the second busbar toward the first busbar; and
the at least one channel comprises:
   a first channel that is proximate to ends of fingers associated with the first set of fingers; and
   a second channel that is proximate to ends of fingers associated with the second set of fingers.

Aspect 3: The apparatus of aspect 1 or 2, wherein:
the electrode structure comprises at least one finger; and
the at least one channel has a longitudinal axis that is substantially orthogonal to a longitudinal axis of the at least one finger.

Aspect 4: The apparatus of aspect 3, wherein:
the at least one channel comprises one channel that is proximate to a boundary of an active track region of the surface-acoustic-wave filter; and
the dielectric material disposed in the one channel is at least partially covered by the at least one finger.

Aspect 5: The apparatus of any previous aspect, wherein:
the electrode structure comprises multiple fingers; and
the dielectric material is at least partially covered by the multiple fingers.

Aspect 6: The apparatus of aspect 5, wherein:
the at least one channel comprises two channels that are approximately parallel to each other and are proximate to a boundary of an active track region of the surface-acoustic-wave filter;
the dielectric material disposed in a first channel of the two channels is at least partially covered by the multiple fingers; and
the dielectric material disposed in a second channel of the two channels is at least partially covered by the multiple fingers.

Aspect 7: The apparatus of aspect 5, wherein:
the at least one channel comprises multiple channels; and
the dielectric material disposed in each channel of the multiple channels is at least partially covered by a corresponding finger of the multiple fingers.

Aspect 8: The apparatus of aspect 7, wherein the multiple channels are arranged along an axis associated with a direction of acoustic-wave propagation.

Aspect 9: The apparatus of aspect 7 or 8, wherein longitudinal axes of the multiple channels are substantially orthogonal to longitudinal axes of the multiple fingers.

Aspect 10: The apparatus of any one of aspects 7-9, wherein the dielectric material disposed in each channel of the multiple channels is fully covered by the corresponding finger of the multiple fingers.

Aspect 11: The apparatus of any previous aspect, wherein a surface of the dielectric material that faces towards the electrode structure is substantially flush with a surface of the piezoelectric layer that faces towards the electrode structure.

Aspect 12: The apparatus of any previous aspect, wherein:
the electrode structure has a pitch; and
a transversal axis of the dielectric material has a width between approximately 30% and 200% of the pitch.

Aspect 13: The apparatus of any previous aspect, wherein a thickness of the dielectric material is between approximately 5% and 100% of a length of two times a pitch of the electrode structure.

Aspect 14: The apparatus of aspect 13, wherein the thickness of the dielectric material is approximately 50% of the length of two times the pitch of the electrode structure.

Aspect 15: The apparatus of aspect 13, wherein the thickness of the dielectric material is between approximately 5% and 20% the length of two times the pitch of the electrode structure.

Aspect 16: The apparatus of any previous aspect, wherein the dielectric material comprises at least one of the following:
tantalum oxide ($Ta_2O_5$);
silicon oxide (SiO),
silicon dioxide ($SiO_2$);
silicon nitride ($Si_3N_4$);
hafnium oxide ($HfO_2$);
aluminium oxide ($Al_2O_3$);
tungsten trioxide ($WO_3$); or
niobium pentoxide ($Nb_2O_5$).

Aspect 17: The apparatus of any previous aspect, wherein:
the surface-acoustic-wave filter comprises multiple cascaded resonators; and
a resonator of the multiple cascaded resonators comprises the piezoelectric layer, the electrode structure, and the dielectric material.

Aspect 18: The apparatus of any previous aspect, wherein:
the surface-acoustic-wave filter comprises a substrate layer;
the substrate layer comprises a compensation layer; and
the piezoelectric layer is disposed between the electrode structure and the compensation layer of the substrate layer.

Aspect 19: The apparatus of any previous aspect, wherein the surface-acoustic-wave filter comprises a thin-film surface-acoustic-wave filter.

Aspect 20: The apparatus of any one of aspects 1-18, wherein the surface-acoustic-wave filter comprises a high-quality temperature-compensated surface-acoustic-wave filter.

Aspect 21: An apparatus comprising:
a surface-acoustic-wave filter configured to generate a filtered signal from a radio-frequency signal, the surface-acoustic-wave filter comprising:

means for converting the radio-frequency signal to an acoustic wave and converting a propagated acoustic wave into the filtered signal;
means for propagating the acoustic wave across a planar surface to produce the propagated acoustic wave; and
means for operating in a piston mode, the means for operating disposed in the means for propagating and at least partially covered by the means for converting.

Aspect 22: The apparatus of aspect 21, wherein the means for operating comprises means for attenuating transversal modes.

Aspect 23: The apparatus of aspect 21 or 22, wherein the means for operating is present within a trap region of the surface-acoustic-wave filter.

Aspect 24: A method of manufacturing a surface-acoustic-wave filter, the method comprising:
providing a piezoelectric layer;
etching at least one channel across a surface of the piezoelectric layer;
depositing dielectric material within the at least one channel; and
providing an electrode structure that at least partially covers the dielectric material.

Aspect 25: The method of aspect 24, wherein the depositing of the dielectric material comprises filling the at least one channel with the dielectric material such that a surface of the dielectric material that faces the electrode structure is substantially flush with the surface of the piezoelectric layer.

Aspect 26: An apparatus comprising:
a piezoelectric layer configured to propagate an acoustic wave along a first axis, the piezoelectric layer having at least one recessed area with a longitudinal axis that is substantially parallel to the first axis; and
dielectric material positioned in the at least one recessed area, the dielectric material having at least one surface exposed.

Aspect 27: The apparatus of aspect 26, further comprising:
an electrode structure that is in contact with the piezoelectric layer and the dielectric material.

Aspect 28: The apparatus of aspect 27, further comprising:
a surface-acoustic-wave filter comprising the piezoelectric layer, the dielectric material, and the electrode structure.

Aspect 29: The apparatus of aspect 28, wherein the dielectric material is present within a trap region of the surface-acoustic-wave filter.

Aspect 30: The apparatus of aspect 29, wherein:
the surface-acoustic-wave filter is configured to generate the acoustic wave such that the acoustic wave has a first velocity within an active track region of the surface-acoustic-wave filter and a second velocity within the trap region; and
the second velocity is lower than the first velocity.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:
1. An apparatus comprising:
a surface-acoustic-wave filter comprising:
a piezoelectric layer having a plurality of segmented channels;
an electrode structure comprising multiple fingers; and
dielectric material disposed in each segmented channel of the plurality of segmented channels of the piezoelectric layer, the dielectric material in each segmented channel of the plurality of segmented channels at least partially covered by a corresponding finger of the multiple fingers of the electrode structure, wherein each segmented channel of the plurality of segmented channels extends laterally beyond the corresponding finger of the multiple fingers.

2. The apparatus of claim 1, wherein:
the electrode structure comprises:
a first busbar and a second busbar;
a first set of fingers of the multiple fingers extending from the first busbar toward the second busbar; and
a second set of fingers of the multiple fingers extending from the second busbar toward the first busbar, wherein the corresponding finger is part of the first set of fingers or the second set of fingers; and
the plurality of segmented channels comprises:
a first plurality of segmented channels that is proximate to ends of fingers associated with the first set of fingers; and
a second plurality of segmented channels that is proximate to ends of fingers associated with the second set of fingers.

3. The apparatus of claim 1, wherein the plurality of segmented channels have a longitudinal axis that is substantially orthogonal to a longitudinal axis of the corresponding finger.

4. The apparatus of claim 3, wherein:
the plurality of segmented channels comprises one channel that is proximate to a boundary of an active track region of the surface-acoustic-wave filter; and
the dielectric material disposed in the one channel is at least partially covered by the corresponding finger.

5. The apparatus of claim 1, wherein the dielectric material in each segmented channel of the plurality of segmented channels is at least partially covered by an end of the corresponding finger of the multiple fingers.

6. The apparatus of claim 5, wherein:
the plurality of segmented channels comprises a first plurality of segmented channels and a second plurality of segmented channels, wherein the first plurality of segmented channels is approximately parallel to the second plurality of segmented channels and is proximate to a boundary of an active track region of the surface-acoustic-wave filter;
the dielectric material disposed in the first plurality of segmented channels is at least partially covered by the multiple fingers; and
the dielectric material disposed in the second plurality of segmented channels is at least partially covered by the multiple fingers.

7. The apparatus of claim 1, wherein the surface-acoustic-wave filter comprises a temperature-compensated surface-acoustic-wave filter.

8. The apparatus of claim 1, wherein the plurality of segmented channels is arranged along an axis associated with a direction of acoustic-wave propagation.

9. The apparatus of claim 1, wherein longitudinal axes of the plurality of segmented channels are substantially orthogonal to longitudinal axes of the multiple fingers.

10. The apparatus of claim 1, wherein the dielectric material disposed in each segmented channel of the plurality of segmented channels is fully covered by the corresponding finger of the multiple fingers.

11. The apparatus of claim 1, wherein a surface of the dielectric material that faces towards the electrode structure is substantially flush with a surface of the piezoelectric layer that faces towards the electrode structure.

12. The apparatus of claim 1, wherein:
the electrode structure has a pitch; and
a transversal axis of the dielectric material has a width between approximately 30% and 200% of the pitch.

13. The apparatus of claim 1, wherein a thickness of the dielectric material is between approximately 5% and 100% of a length of two times a pitch of the electrode structure.

14. The apparatus of claim 13, wherein the thickness of the dielectric material is approximately 50% of the length of two times the pitch of the electrode structure.

15. The apparatus of claim 13, wherein the thickness of the dielectric material is between approximately 5% and 20% of the length of two times the pitch of the electrode structure.

16. The apparatus of claim 1, wherein the dielectric material comprises at least one of the following:
tantalum oxide ($Ta_2O_5$);
silicon oxide (SiO);
silicon dioxide ($SiO_2$);
silicon nitride (SiN);
hafnium oxide ($HfO_2$);
aluminium oxide ($Al_2O_3$);
tungsten trioxide ($WO_3$); or
niobium pentoxide ($Nb_2O_5$).

17. The apparatus of claim 1, wherein:
the surface-acoustic-wave filter comprises multiple cascaded resonators; and
a resonator of the multiple cascaded resonators comprises the piezoelectric layer, the electrode structure, and the dielectric material.

18. The apparatus of claim 1, wherein:
the surface-acoustic-wave filter comprises a substrate layer;
the substrate layer comprises a compensation layer; and
the piezoelectric layer is disposed between the electrode structure and the compensation layer of the substrate layer.

19. The apparatus of claim 1, wherein the surface-acoustic-wave filter comprises a thin-film surface-acoustic-wave filter (TFSAW).

20. An apparatus comprising:
a piezoelectric layer configured to propagate an acoustic wave along a first axis, the piezoelectric layer having a plurality of segmented recessed areas with a longitudinal axis that is substantially parallel to the first axis;
an electrode structure comprising multiple fingers; and
dielectric material positioned in the plurality of segmented recessed areas, the dielectric material having at least one surface exposed, the dielectric material in each segmented recessed area at least partially covered by a corresponding finger of the multiple fingers of the electrode structure, wherein each segmented recessed area of the plurality of segmented recessed areas extends laterally beyond the corresponding finger of the multiple fingers.

21. The apparatus of claim 20, the electrode structure is in contact with the piezoelectric layer and the dielectric material.

22. The apparatus of claim 21, further comprising:
a surface-acoustic-wave filter comprising the piezoelectric layer, the dielectric material, and the electrode structure.

23. The apparatus of claim 22, wherein the dielectric material is present within a trap region of the surface-acoustic-wave filter.

24. The apparatus of claim 23, wherein:
the surface-acoustic-wave filter is configured to generate the acoustic wave such that the acoustic wave has a first velocity within an active track region of the surface-acoustic-wave filter and a second velocity within the trap region; and
the second velocity is lower than the first velocity.

* * * * *